US008175292B2

(12) United States Patent
Aylward et al.

(10) Patent No.: US 8,175,292 B2
(45) Date of Patent: May 8, 2012

(54) AUDIO SIGNAL PROCESSING

(76) Inventors: J. Richard Aylward, Ashland, MA (US); Erik E. Anderson, San Mateo, CA (US)

( * ) Notice: Subject to any disclaimer, the term of this patent is extended or adjusted under 35 U.S.C. 154(b) by 1368 days.

(21) Appl. No.: 11/463,791

(22) Filed: Aug. 10, 2006

(65) Prior Publication Data

US 2006/0291669 A1 Dec. 28, 2006

Related U.S. Application Data

(63) Continuation of application No. 09/886,868, filed on Jun. 21, 2001, now Pat. No. 7,164,768.

(51) Int. Cl.
*H03G 5/00* (2006.01)

(52) U.S. Cl. ............. 381/98; 381/17; 381/356; 381/358

(58) Field of Classification Search .............. 381/97–99, 381/356, 358, 387, 309–310, 17–18, 1, 300
See application file for complete search history.

(56) References Cited

U.S. PATENT DOCUMENTS

| | | | | | |
|---|---|---|---|---|---|
| 4,933,768 | A | | 6/1990 | Ishikawa et al. | |
| 5,251,260 | A | | 10/1993 | Gates | |
| 5,557,680 | A | | 9/1996 | Janes | |
| 5,621,804 | A | | 4/1997 | Beppu | |
| 5,809,150 | A | * | 9/1998 | Eberbach | 381/300 |
| 5,809,153 | A | | 9/1998 | Aylward et al. | |
| 5,870,484 | A | * | 2/1999 | Greenberger | 381/300 |
| 5,953,432 | A | | 9/1999 | Yanagawa et al. | |
| 6,154,545 | A | | 11/2000 | Kohut et al. | |
| 6,198,827 | B1 | | 3/2001 | Waller, Jr. | |
| 6,421,446 | B1 | * | 7/2002 | Cashion et al. | 381/17 |
| 6,711,266 | B1 | | 3/2004 | Aylward | |
| 6,898,470 | B1 | * | 5/2005 | Rao et al. | 700/94 |

FOREIGN PATENT DOCUMENTS

| | | |
|---|---|---|
| DE | 198 47 689 A1 | 4/2000 |
| EP | 0 858 243 A2 | 8/1998 |
| EP | 1272004 | 1/2003 |
| JP | 2003047099 | 2/2003 |
| WO | WO 90/00851 | 1/1990 |
| WO | WO 97/25834 | 7/1997 |

OTHER PUBLICATIONS

Damaske, P. "Head-Related Two Channel Stereophony with Loudspeaker Reproduction." Journal of the Acoustical Society of America, American Institute of Physics 50.4 (1971) 1109-1115.
J. Richard Aylward et al. "Audio Signal Processing," U.S. Appl. No. 09/886,868, filed Jun. 21, 2001.
European Search Report, dated Aug. 6, 2004.
EP Examination Report dated Nov. 10, 2009 for EP02100699.4.

* cited by examiner

*Primary Examiner* — Devona Faulk
*Assistant Examiner* — Disler Paul

(57) ABSTRACT

A method for processing and transducing audio signals. An audio system has a first audio signal and a second audio signal that have amplitudes. A method for processing the audio signals includes dividing the first audio signal into a first spectral band signal and a second spectral band signal; scaling the first spectral band signal by a first scaling factor proportional to the amplitude of the second audio signal; and scaling the first spectral band signal by a second scaling factor to create a second signal portion. Other portions of the disclosure include application of the signal processing method to multichannel audio systems, and to audio systems having different combinations of directional loudspeakers, full range loudspeakers, and limited range loudspeakers.

14 Claims, 15 Drawing Sheets

| SWITCH 110 POSITION | SWITCH 118 POSITION | LC' CONTENT (TERM. 37) | L' CONTENT (TERM. 35) | PRIMARY 104 NULL 106 | PRIMARY 106 NULL 104 | REF. FIG. |
|---|---|---|---|---|---|---|
| OPEN | OPEN | LC | L | LC | L+LS(LF) | 10a |
| CLOSED | OPEN | L+LC | ——— | L+LC | LS | 10b |
| OPEN | CLOSED | ——— | L+LC | ——— | L+LC+LS(LF) | 10c |
| CLOSED | CLOSED | ——— | L+LC | ——— | L+LC+LS(LF) | 10d |

AUDIO SIGNAL PROCESSING

CROSS-REFERENCE TO RELATED APPLICATIONS

This application is a continuation and claims the benefit of priority under 35 USC 120 of U.S. application Ser. No. 09/886,868, entitled AUDIO SIGNAL PROCESSING, filed Jun. 21, 2001 now U.S. Pat. No. 7,164,768.

STATEMENT REGARDING FEDERALLY SPONSORED RESEARCH OR DEVELOPMENT

Not applicable.

The invention relates to audio signal processing in audio systems having multiple directional channels, such as so-called “surround systems,” and more particularly to audio signal processing that can adapt multiple directional channel systems to audio systems having fewer or more loudspeaker locations than the number of directional channels.

BACKGROUND OF THE INVENTION

For background, reference is made to surround sound systems and U.S. Pat. Nos. 5,809,153 and 5,870,484. It is an important object of the invention to provide an improved audio signal processing system for the processing of directional channels in a multi-channel audio system.

BRIEF SUMMARY OF THE INVENTION

According to the invention, an audio system has a first audio signal and a second audio signal having amplitudes. A method for processing the audio signals includes dividing the first audio signal into a first spectral band signal and a second spectral band signal; scaling the first spectral band signal by a first scaling factor to create a first signal portion, wherein the first scaling factor is proportional to the amplitude of the second audio signal; and scaling the first spectral band signal by a second scaling factor to create a second signal portion.

In another aspect of the invention. An audio system has a first audio signal, a second audio signal and a directional loudspeaker unit. A method for processing the audio signals includes electroacoustically directionally transducing the first audio signal to produce a first signal radiation pattern; electroacoustically directionally transducing the second audio signal to produce a second signal radiation pattern, wherein the first signal radiation pattern and the second signal radiation pattern are alternatively and user selectively similar or different.

In another aspect of the invention. An audio system has a first audio signal, a second audio signal, and a third audio signal that is substantially limited to a frequency range having a lower limit at a frequency that has a corresponding wavelength that approximates the dimensions of a human head. The audio system further includes a directional loudspeaker unit, and a loudspeaker unit, distinct from the directional loudspeaker unit. A method for processing the audio signals, includes electroacoustically directionally transducing by the directional loudspeaker unit the first audio signal to produced a first radiation pattern; electroacoustically directionally transducing by the directional loudspeaker unit the second audio signal to produce a second radiation pattern; and electroacoustically transducing by the distinct loudspeaker unit the third audio signal.

In another aspect of the invention, an audio system has a plurality of directional channels. A method for processing audio signals respectively corresponding to each of the plurality of channels includes dividing a first audio signal into a first audio signal first spectral band signal and a first audio signal second spectral band signal; scaling the first audio signal first spectral band signal by a first scaling factor to create a first audio signal first spectral band first portion signal; scaling the first spectral band signal by a second scaling factor to create a first audio signal first spectral band second portion signal; dividing a second audio signal into a second audio signal first spectral band signal and a second audio signal second spectral band signal; scaling the second audio signal first spectral band signal by a third scaling factor to create a second audio signal first spectral band first portion signal; and scaling the second audio signal first spectral band signal by a fourth scaling factor to create a second audio signal first spectral band second portion signal.

In another aspect of the invention, a method for processing an audio signal includes filtering the signal by a first filter that has a frequency response and time delay effect similar to the human head to produce a once filtered signal. The method further includes filtering the once filtered audio signal by a second filter, the second filter having a frequency response and time delay effect inverse to the frequency and time delay effect of a human head on a sound wave.

In another aspect of the invention, an audio system has a plurality of directional channels, a first audio signal and a second audio signal, the first and second audio signals representing adjacent directional channels on the same lateral side of a listener in a normal listening position. A method for processing the audio signals includes dividing the first audio signal into a first spectral band signal and a second spectral band signal; scaling the first spectral band signal by a first time varying calculated scaling factor to create a first signal portion; and scaling the first spectral band signal by a second time varying calculated scaling factor to create a second signal portion.

In still another aspect of the invention, and audio system has an audio signal, a first electroacoustical transducer designed and constructed to transduce sound waves in a frequency range having a lower limit, and a second electroacoustical transducer designed and constructed to transduce sound waves in a frequency range having a second transducer lower limit that is lower than the first transducer lower limit. A method for processing audio signals, includes dividing the audio signal into a first spectral band signal and a second spectral band signal; scaling the first spectral band signal by a first scaling factor to create a first portion signal; scaling the first spectral band signal by a second scaling factor to create a second portion signal; transmitting the first portion to the first electroacoustical transducer for transduction; and transmitting said second portion signal to said second electroacoustical transducer for transduction.

Other features, objects, and advantages will become apparent from the following detailed description, which refers to the following drawing in which:

BRIEF DESCRIPTION OF THE SEVERAL VIEWS OF THE DRAWING

FIGS. 2*b* and 2*c* are block diagrams of audio signal processing systems for creating directional channels in accordance with the invention;

DETAILED DESCRIPTION

Figure 1A:
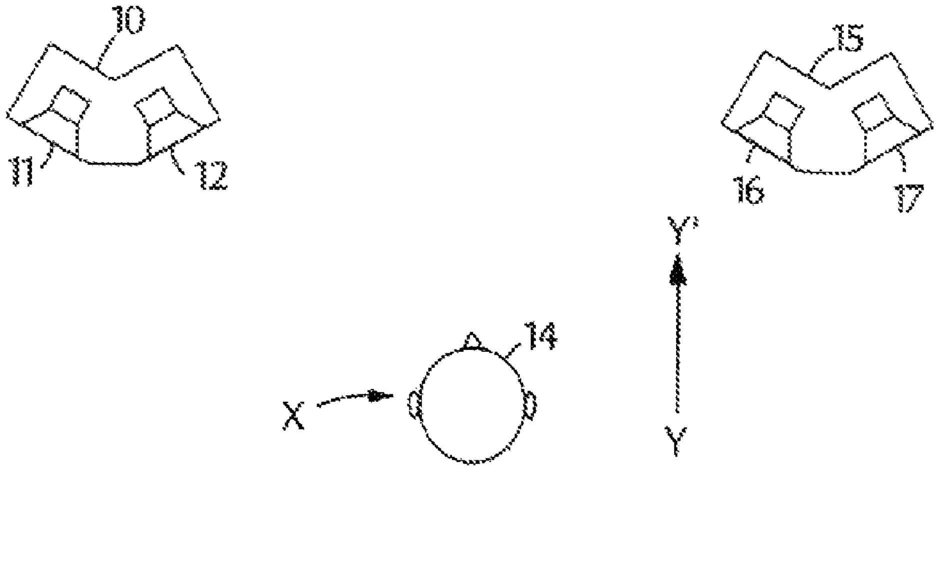
FIGS. 1*a*-1*c* are diagrammatic views of configurations of loudspeaker units for use with the invention.
Figure 1B:
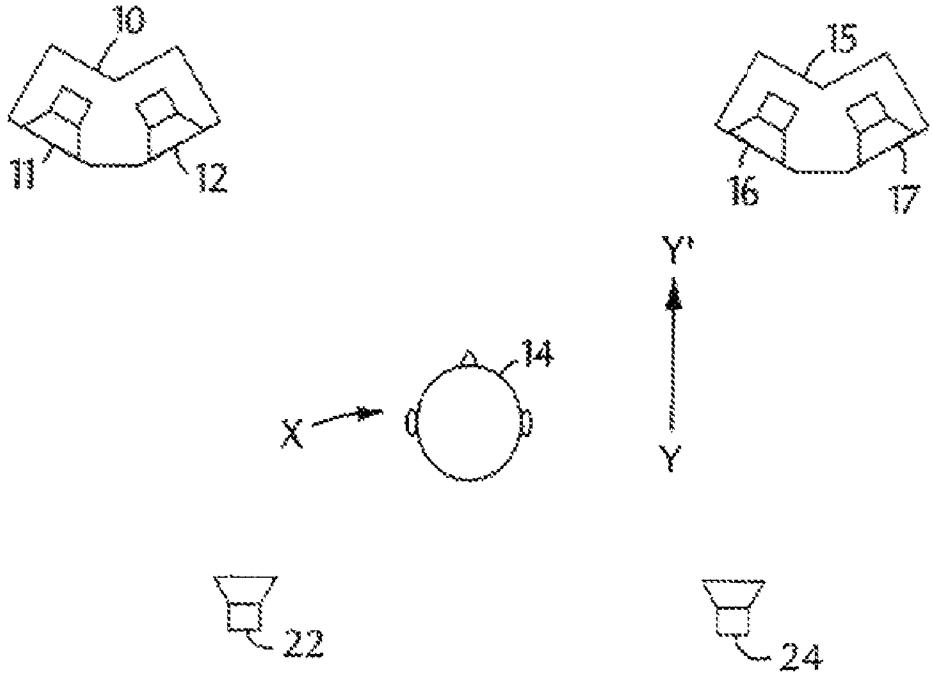
Figure 1C:
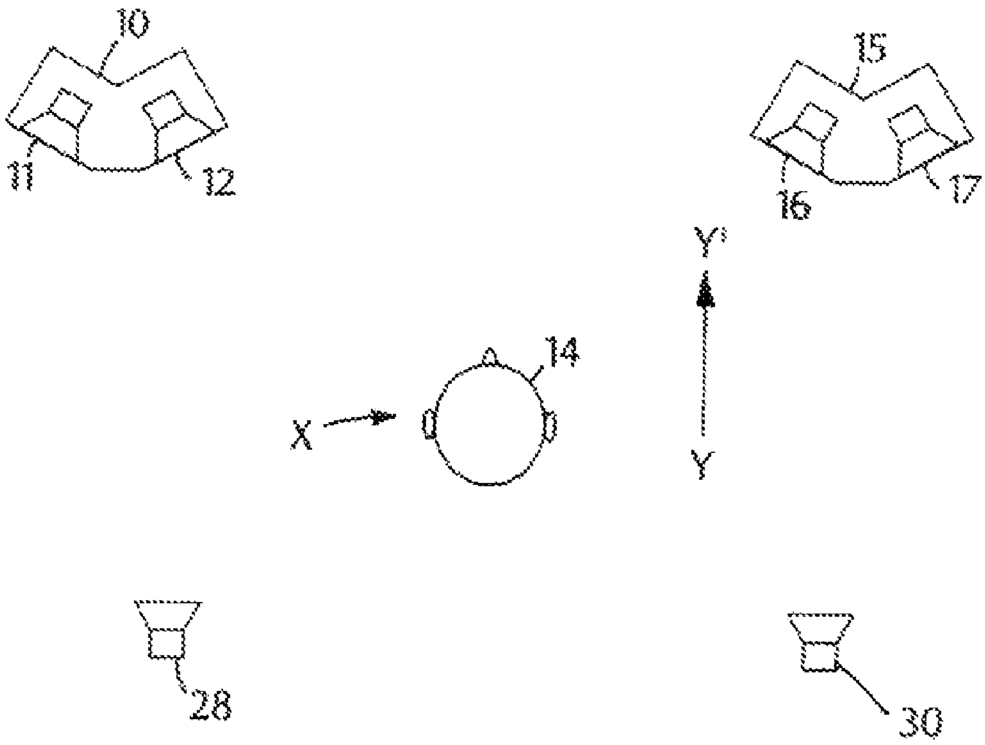
Figure 2B:
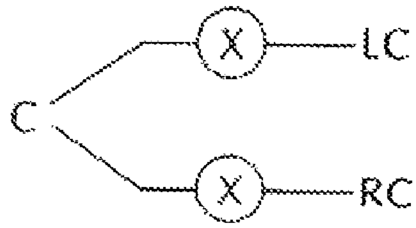
FIGS. 2*b* and 2*c* are block diagrams of audio signal processing systems
Figure 2C:
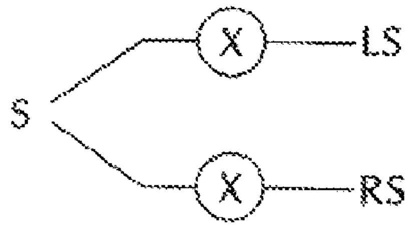

With reference now to the drawing and more particularly to FIGS. 1*a*-1*c*, there are shown top diagrammatic views of three configurations or surround sound audio loudspeaker units according to the invention. In FIG. 1*a*, two directional arrays each including two full range (as defined below in the discussion of FIGS. 2*a*-2*c*) acoustical drivers are positioned in front of a listener 14. A first array 10 including acoustical drivers 11 and 12 may be positioned to the listener's left and a second array 15, including acoustical drivers 16 and 17 may be positioned to the listener's right. In FIG. 1*b*, two directional arrays each including two full range acoustical drivers are positioned in front of a listener 14. A first array 10 including acoustical drivers 11 and 12 may be positioned to the listener's left and a second array 15, including acoustical drivers 16 and 17 may be positioned to the listener's right. In addition, a first limited range (as defined below in the discussion of FIGS. 2*a*-2*c*) acoustical driver 22 is positioned behind the listener, to the listener's left, and a second limited range acoustical driver 24 is positioned behind the listener to the listener's right. In FIG. 1*c*, two directional arrays each including two full range acoustical drivers are positioned in front of a listener 14. A first array 10 including acoustical drivers 11 and 12 may be positioned to the listener's left and a second array 15, including acoustical drivers 16 and 17 may be positioned to the to the listener's right. In addition, a first full range acoustical driver 28 is positioned behind the listener, to the listener's left, and a second limited range acoustical driver 30 is positioned behind the listener to the listener's right. Other surround sound loudspeaker systems may have loudspeaker units in additional locations, such as directly in front of listener 14. Surround sound systems may radiate sound waves in a manner that the source of the sound may be perceived by the listener to be in a direction (for example direction X) relative to the listener at which there is no loudspeaker unit. Surround sound systems may further attempt to radiate sound waves in a manner such that the source of the sound may be perceived by the listener to be moving (for example in direction Y-Y') relative to the viewer Referring to FIG. 2*a*, there is shown a block diagram of an audio signal processing system for providing audio signals for the loudspeaker units of FIGS. 1*a*-1*c*. An audio signal source 32 is coupled to a decoder 34 which decodes the audio source from the audio signal source into a plurality of channels, in this case a low frequency effects (LFE) channel, and bass channel, and a number of directional channels, including a left surround (LS) channel, a left (L) channel, a left center (LC) channel, a right center (RC) channel, a right (R) channel, and a right surround (RS) channel. Other decoding systems may output a different set of channels. In some systems, the bass channel is not broken out separately from the directional channels, but instead remains combined with the directional channels. In other systems, there may be a single center (C) channel, instead of the RC and LC channels, or there may be a single surround channel. An audio system according to the invention may be used with any combination of directional channels, either by adapting the signal processing to the channels, or by decoding the directional channels to produce additional directional channels. One method of decoding a single C channel into an RC channel and an LC channel is shown in FIG. 2*b*. The C channel is split into an LC channel and an RC channel and the LC and the RC channel are scaled by a factor, such as 0.707. Similarly, a method of decoding a single S channel into an RS channel and an LS channel is shown in FIG. 2*c*. The S channel is split into an RS channel and an LS channel, and the RS channel and LS channel are scaled by a factor, such as 0.707. If the audio input signal has no surround channel or channels, there are several known methods for synthesizing surround channels from existing channels, or the system may be operated without surround sound.

Some surround sound systems have a separate low frequency unit for radiating low frequency spectral components and "satellite" loudspeaker units for radiating spectral components above the frequencies radiated by the low frequency units. Low frequency units are referred to by a number of names, including "subwoofers" "bass bins" and others.

Figure 2A:
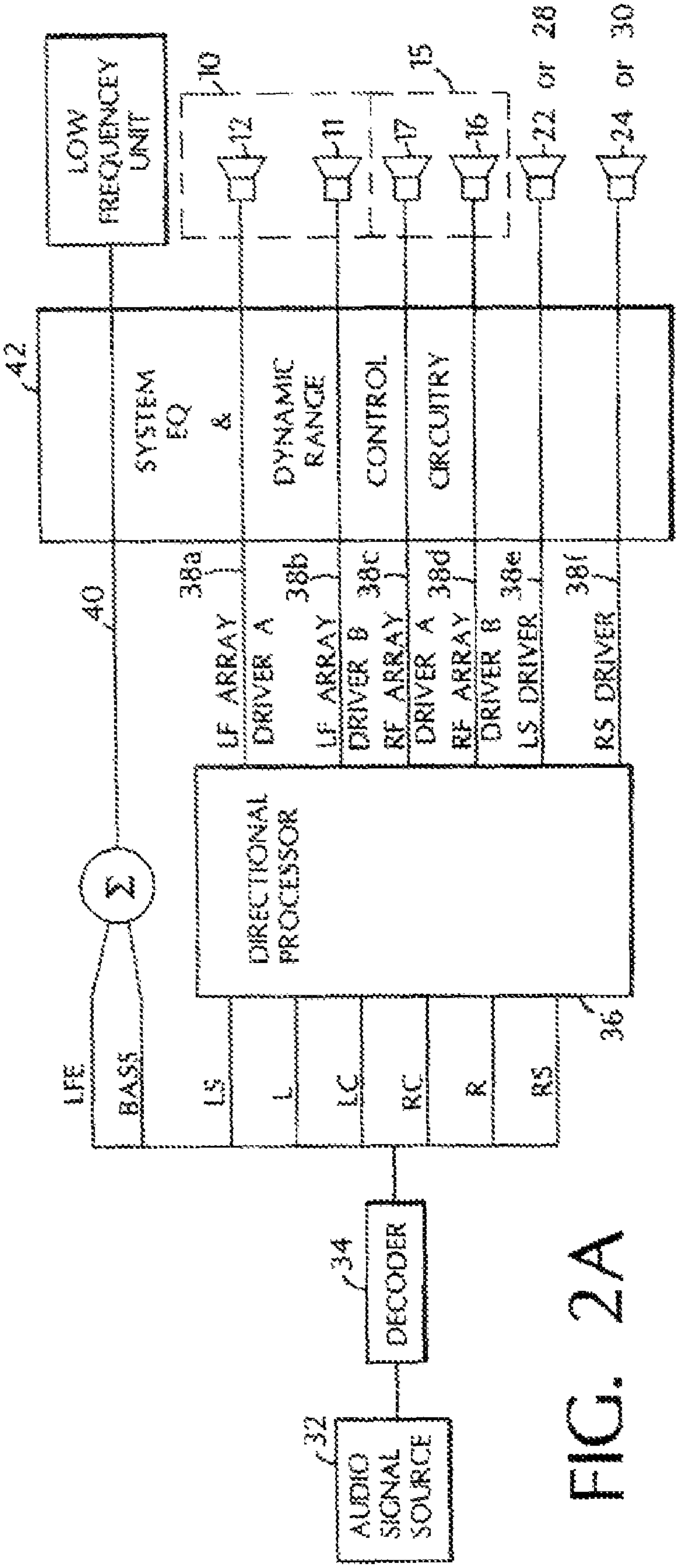
FIG. 2*a* is a block diagram of an audio signal processing system incorporating the invention.

In surround sound systems having both and LFE channel and a bass channel, the LFE and bass channels may be combined and radiated by the low frequency unit, as shown in FIG. 2*a*. In surround systems not having a combined bass channel, each directional channel, including the bass portion of each directional channel) may be radiated by separate directional loudspeaker units, with only the LFE radiated by the low frequency unit. Still other surround systems may have more than one low frequency unit, one for radiating bass frequencies and one for radiating the LFE channel. "Full range" as used herein, refers to audible spectral components having frequencies above those radiated by a low frequency unit. If an audio system has no low frequency unit, "full range" refers to the entire audible frequency spectrum. "Directional channel" as used herein is an audio channel that contains audio signals that are intended to be transduced to sound waves that appear to come from a specific direction. LFE channels and channels that have combined bass signals from two or more directional channels are not, for the purposes of this specification, considered directional channels.

The directional channels, LS, L, LC, RC, R, and RS are processed by directional processor 36 to produce output audio signals at output signal lines 38*a*-38*f* for the acoustical drivers of the audio system. The signals output by directional processor 36 and the low frequency unit signal in signal line 40 may then be further processed by system equalization (EQ) and dynamic range control circuitry 42. (System EQ and dynamic range control circuitry is shown to illustrate the placement of elements typical to audio processing circuitry, but does not perform a function relevant to the invention. Therefore, system EQ and dynamic range control circuitry 42 are not shown in subsequent figures and its function will not be further described. Other audio processing elements, such as amplifiers that are not germane to the present invention are not shown or described). The directional channels are then transmitted to the acoustical drivers for transduction to sound waves. The signal line 38*a* designated "left front (LF) array driver A" is directed to acoustical driver 12 of array 10 (of FIGS. 1*a*-1*c*); the signal line 38*b* designated "left front (LF) array driver B" is directed to acoustical driver 11 of array 10 (of FIGS. 1*a*-1*c*); the signal line 38*c* designated "right front (RF) array driver A" is directed to acoustical driver 17 of array 15 (of FIGS. 1*a*-1*c*); and the signal line 38*d* designated "right front (RF) array driver B" is directed to acoustical driver 16 of array 15 (of FIGS. 1*a*-1*c*). The signal line 38*e* designated "left surround (LS) driver" is directed to limited range acoustical driver 22 of FIG. 1*b* or acoustical driver 28 of FIG. 1*c* as will be explained below, and the signal line 38*f* designated "right surround (RS) driver" is directed to acoustical driver 24 of FIG. 1*b* or acoustical driver 30 of FIG. 1*c*, as will also be explained below. In some implementations, there is no output signal from LS output terminal 38*e* or RS output terminal 38*f* or both. In other implementations one or both of LS output terminal 38*e* or RS output terminal 38*f* may be absent entirely, as will be explained below.

Referring now to FIGS. 3*a*-3*d*, there are shown four block diagrams of audio directional processor 36 for use with surround sound loudspeaker systems as shown in FIGS. 1*a*-1*c*. FIGS. 3*a*-3*d* show the portion of the directional processor for the LC, LS, and L channels. In each of the implementations, there is a mirror image for processing the RC, RS, and R channels. In FIGS. 3*a*-3*d*, like reference numerals refer to like elements performing like functions.

Figure 3A:
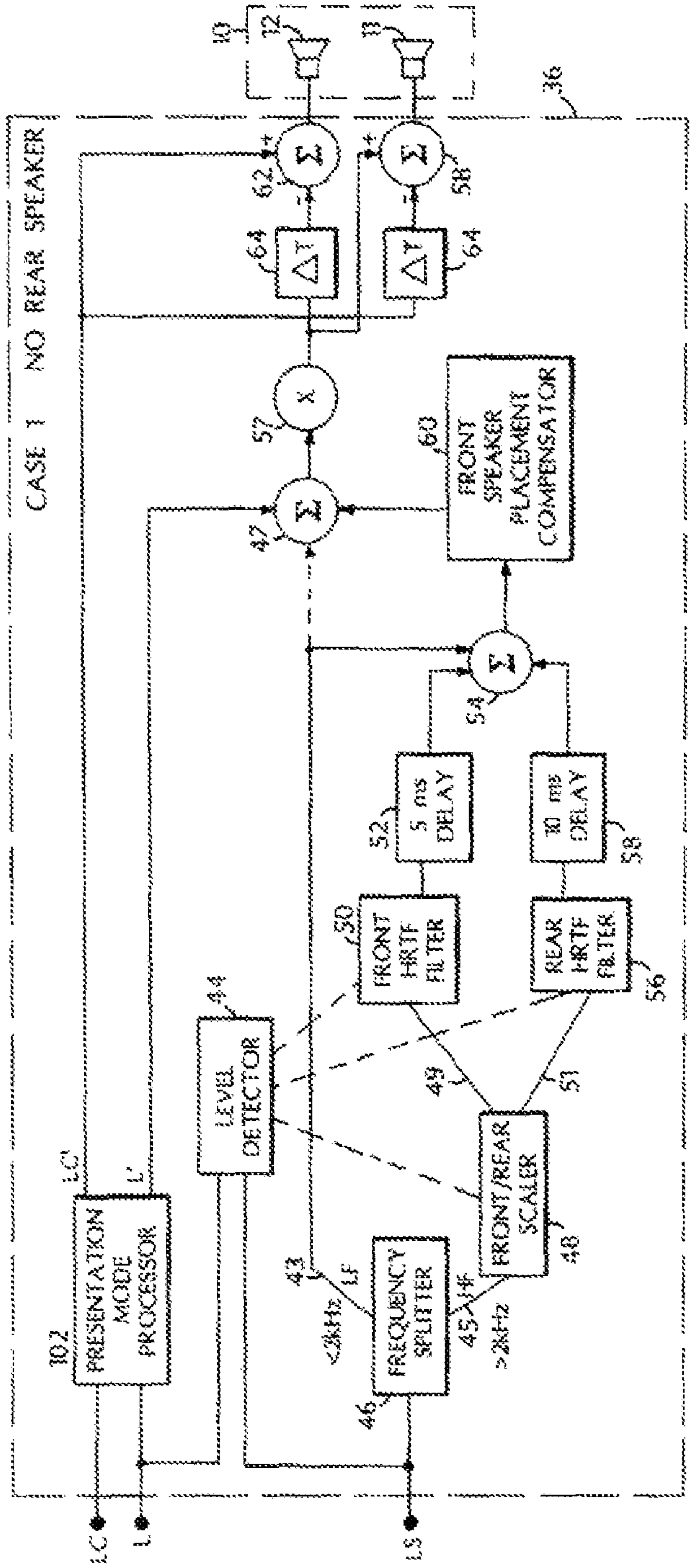
FIGS. 3*a*-3*d* are block diagrams of alternate directional processors for use in the audio signal processing system of FIG. 2*a;*

FIG. 3*a* shows the logical arrangement of directional processor 36 for a configuration having no rear speakers. In FIG. 3*a*, the L channel is coupled to presentation mode processor 102 and to level detector 44. One output terminal 35 of presentation mode processor 102, designated L', is coupled to summer 47. The operation of presentation mode processor 102 will be described below in the discussion of FIG. 11. LS channel is coupled to level detector 44 and frequency splitter 46. Level detector 44 provides front/rear scaler 48, front head related transfer function (HRTF) filters and rear HRTF filters with signal levels to facilitate the calculation of filter coefficients as will be described below. Frequency splitter 46 separates the signal into a first frequency band including signals below a threshold frequency and a second frequency band including signals above the threshold frequency. The threshold frequency is a frequency that corresponds to a wavelength that approximates dimensions of a human head. A convenient frequency is 2 kHz, which corresponds to a wavelength of about 6.8 inches. Hereinafter, the portion of the surround signal above the threshold frequency will be referred to as "high frequency surround signal" and the portion of the surround signal below the threshold frequency will be referred to as "low frequency surround signal." The low frequency surround signal is input by signal path 43 to summer 54, or alternatively to summer 47 as will be explained in the discussion of FIG. 3*d*. The high frequency surround signal is input by signal path 45 to front/rear sealer 48, which splits the high frequency surround signal into a "front" portion and a "rear" portion in a manner that will be described below in the discussion of FIG. 4. The "front" portion of the high frequency surround signal is transmitted by signal line 49 to front head related transfer function (HRTF) filter 50, where it is modified in a manner that will be described below in the discussion of FIG. 4. Modified front high frequency surround is then optionally delayed by five ms by delay 52 and input to summer 54. "Rear" portion of the high frequency surround signal is transmitted by signal line 51 to rear HRTF filter 56, where it is modified in a manner that will be described below in the discussion of FIG. 4. The modified rear portion is then optionally delayed by ten ms by delay 58, and summed with front portion and low frequency surround signal at summer 54. The summed front, rear, and low frequency surround portions are modified by front speaker placement compensator 60 (which will be further explained below following the discussion of FIGS. 4 and 5) and input to summer 47, so that at summer 47 the L channel, the low frequency surround, and the modified high frequency surround are summed. The output signal of summer 47 may then be adjusted by a left/right balance control represented by multiplier 57 and is then input subtractively through time delay 61 to summer 62 and additively to summer 58. LC channel is coupled to presentation mode processor 102. Output terminal 37, designated LC' of presentation mode processor 102 is coupled additively to summer 62 and subtractively through time delay 64 to summer 58. Output signal of summer 58 is transmitted to acoustical driver 11 (of FIGS. 1 and 2). Output signal of summer 62 is transmitted to acoustical driver 12 (of FIGS. 1 and 2). Time delays 61 and 64 facilitate the directional radiation of the signals combined at summer 47. If desired, the outputs of time delay 61 and 64 can be sealed by a factor such as 0.631 to improve directional radiation performance. Directional radiation using time delays is discussed in U.S. Pat. Nos. 5,809,153 and 5,870,484 and will be further discussed below.

Figure 3B:
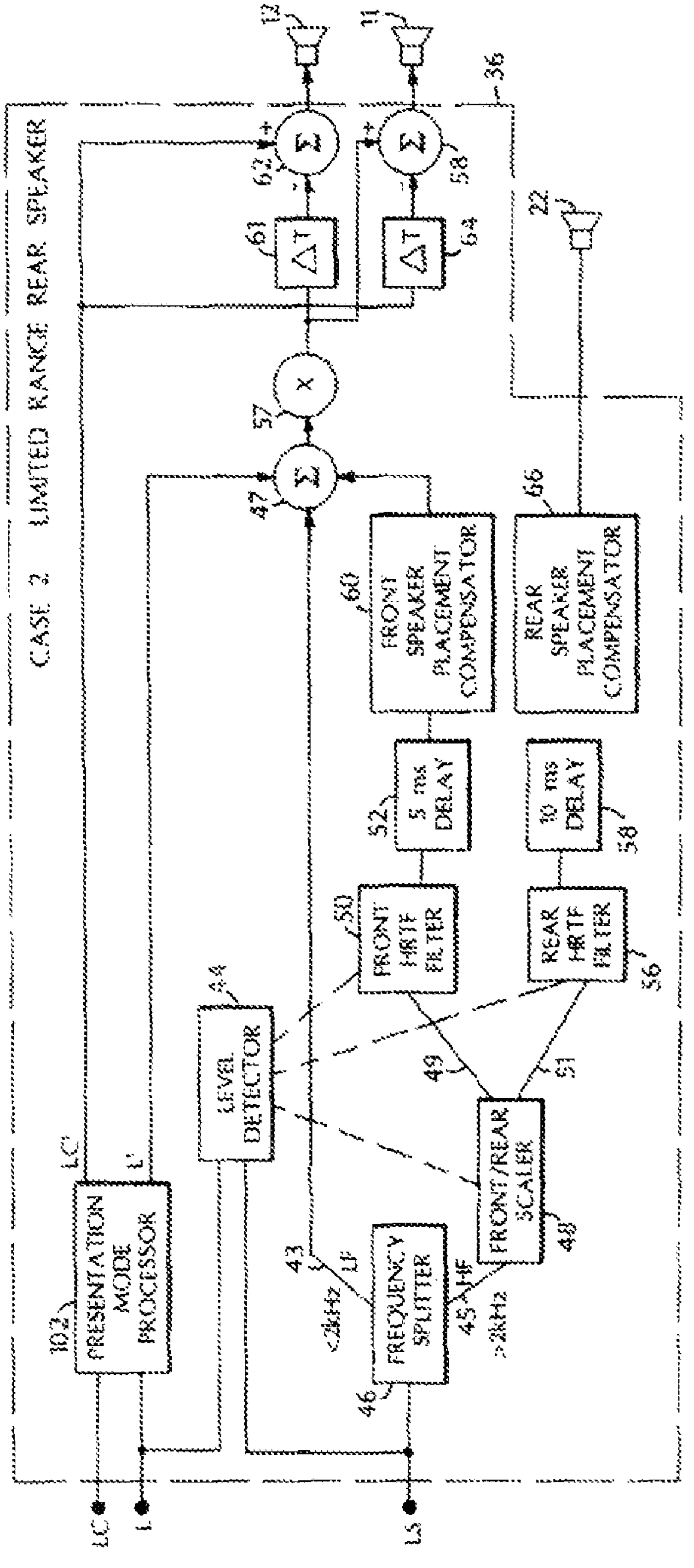

FIG. 3*b* shows directional processor 36 for a configuration having a limited range rear speaker, that is, a speaker that is designed to radiate frequencies above the threshold frequency. In the circuitry of FIG. 3*b*, summer 54 of FIG. 3*a* is not present. Instead, front HRTF filters and optional five ms delay are coupled through front speaker placement compensator 60 to summer 47 and rear HRTF filters and optional ten ms delay are coupled to rear speaker placement compensator 66, which is in turn coupled to limited range acoustical driver 22 of FIGS. 1 and 2.

Figure 3C:
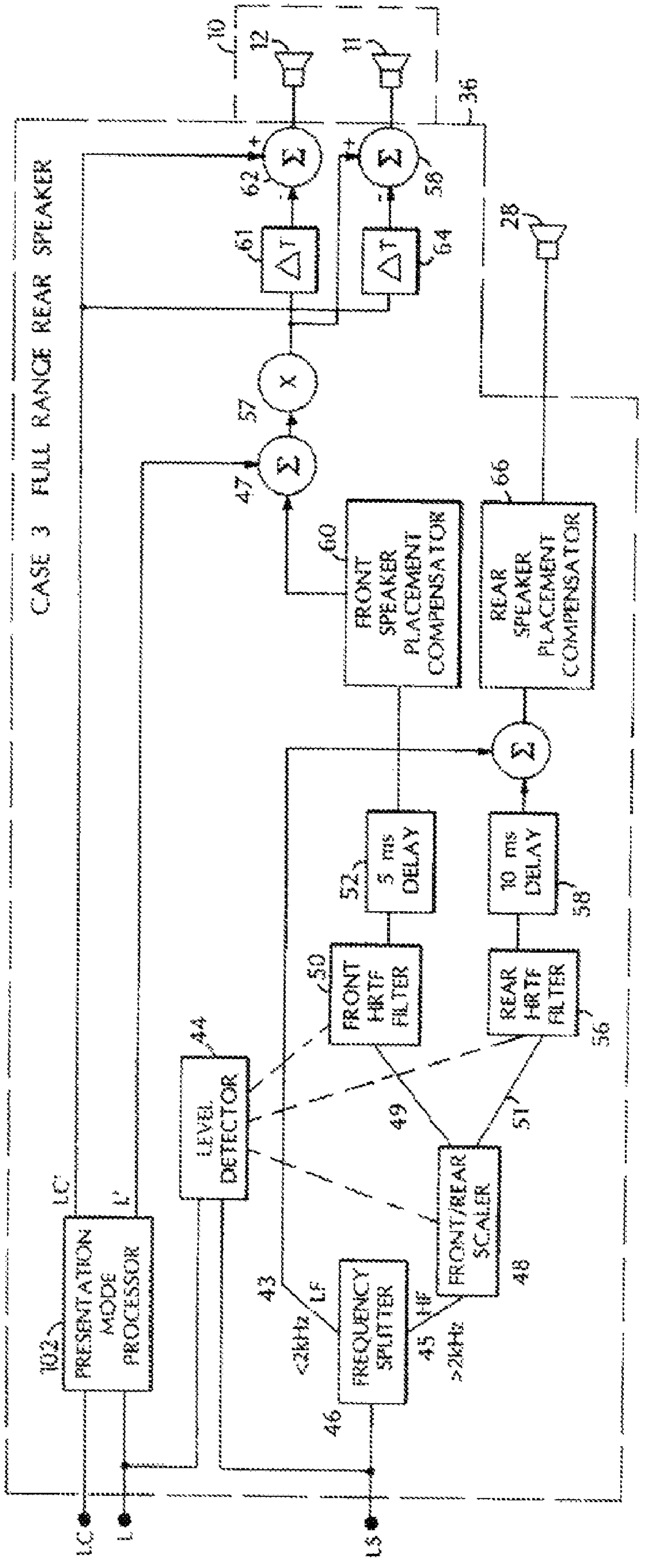

FIG. 3*c* shows directional processor 36 for a configuration having a full range rear speaker, that is, a speaker that is designed to radiate the full audible spectrum of frequencies above the frequencies radiated by a low frequency unit. The circuitry of FIG. 3*c* is similar to the circuitry of FIG. 3*b*, but low frequency surround signal output of frequency splitter 46 is summed with output signal of rear HRTF filter and optional ten ms delay 58 at summer 70, which is output to full-range acoustical driver 28.

Figure 3D:
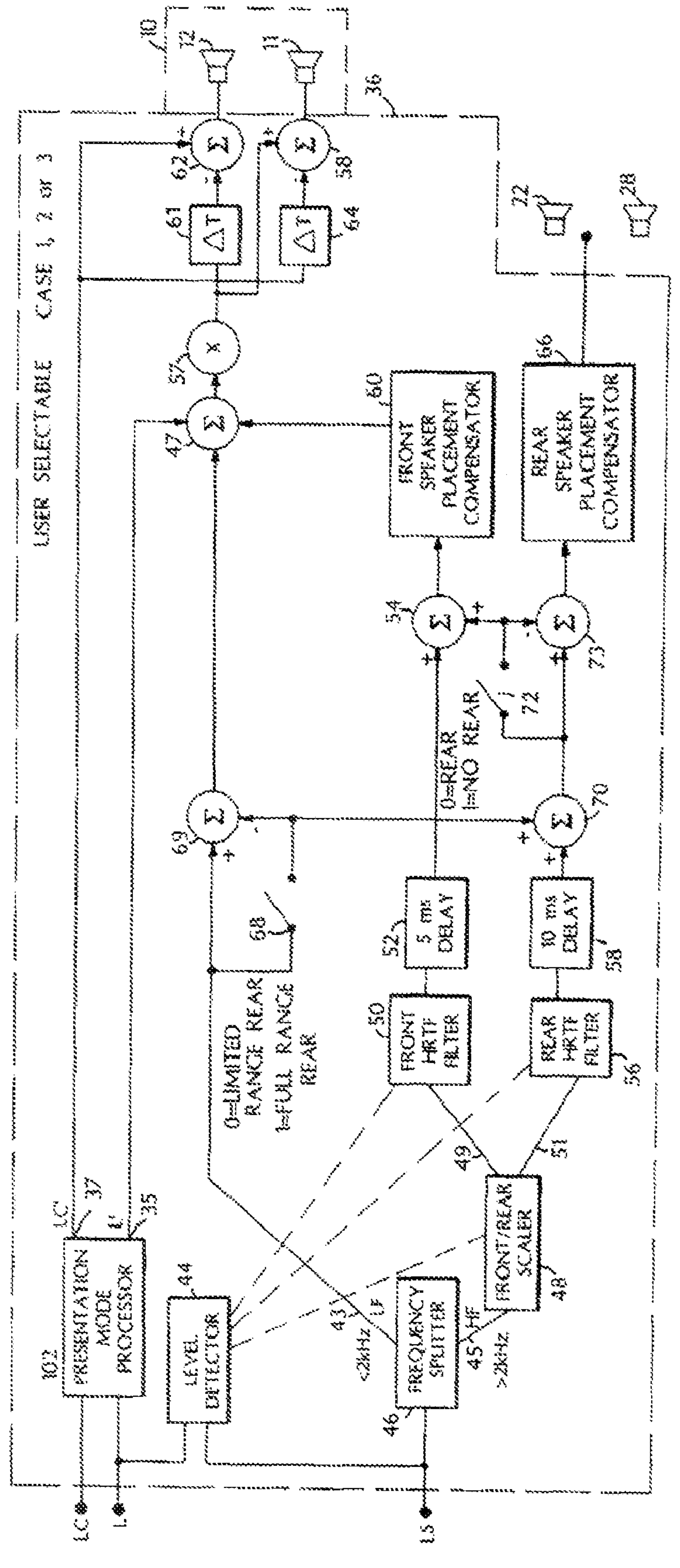

FIG. 3*d* shows directional processor 36 that can be used with no rear speaker, with a limited-range rear speaker, or with a full range rear speaker. FIG. 3*d* includes a switch 68 and summer 69 arranged so that with switch 68 in a closed position, the low frequency surround signal is directed to summer 70. With switch 68 in an open position, the low frequency is directed to summer 47 for radiation from the front speaker array. FIG. 3*d* further includes a switch 72 and summer 73, arranged so that with switch 72 in an open position, the output signal from summer 70 is directed to rear speaker placement compensator 66 for radiation from a rear speaker. With switch 72 in a closed position, the output signal from summer 70 is directed to summer 54. With switch 72 in an open position and 68 in an open position, the circuitry of FIG. 3*d* becomes the circuitry of FIG. 3*b*. With switch 72 in an open position and switch 68 in a closed position, the circuitry of FIG. 3*d* becomes the circuitry of FIG. 3*c*. With switch 72 in a closed position and switch 68 in a closed position, the circuitry of FIG. 3*d* (since the effect of the signal on line 43 being coupled to summer 54 as in the embodiment of FIG. 3*d* is functionally equivalent to the signal on line 43 being directly connected to summer 54 as in the embodiment of FIG. 3*a*) becomes the circuitry of FIG. 3*a*. With switch 72 in a closed position and switch 68 in an open position, the circuitry of FIG. 3*d* becomes the circuitry of FIG. 3*a*, with the low frequency surround signal directed to summer 47.

In operation, switch 72 is set to the open position when there is a rear speaker and to the closed position when there is no rear speaker. Switch 68 is set to the open position for a limited range rear speaker and to the closed position for a full range rear speaker. Logically if switch 72 is set to the closed position, the position of switch 68 should be irrelevant. It was stated in the preceding paragraph that that if switch 72 is in the closed position, the low frequency surround signal may be summed with the high frequency surround signal before or after the front speaker placement compensator depending on the position of switch 68. However, as will be explained below in the discussion of FIG. 4, the front and rear speaker placement compensators have little effect on frequencies below the threshold frequency, so it does not matter whether the low frequency surround is summed with the high frequency surround before or after the front speaker placement compensator. Alternatively, switches 68 and 72 could be linked so that if switch 72 is in the closed position, switch 68 would automatically be set to the open or closed position as desired.

In an exemplary embodiment, the directional processor 36 is implemented as digital signal processors (DSPs) executing instructions with digital-to-analog and analog-to-digital converters as necessary. In other embodiments, the directional processor 36 may be implemented as a combination of DSPs, analog circuit elements, and digital-to-analog and analog-to-digital converters as necessary.

Figure 4:
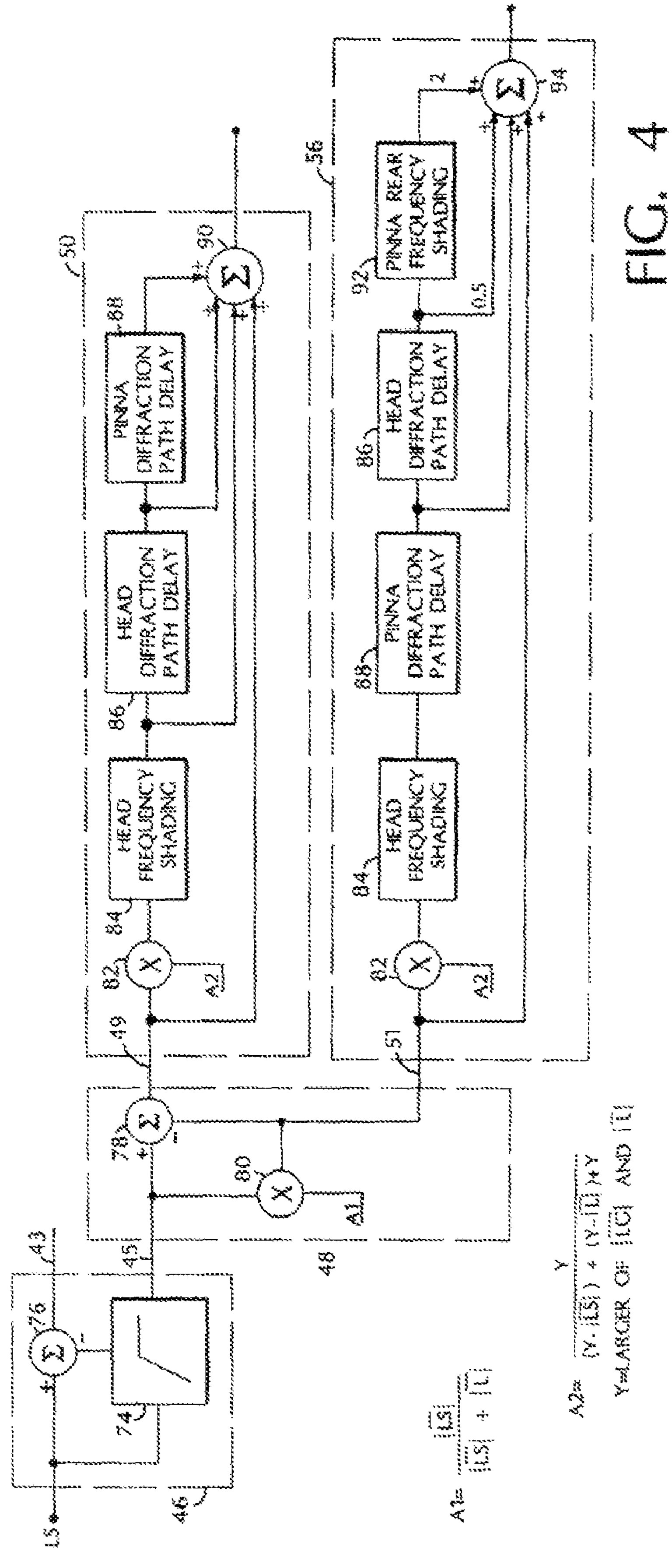
FIG. 4 is a block diagram of some of the components of the directional processors of FIGS. 3*a*-3*c;*

FIG. 4 shows the frequency splitter 46, the front/rear scaler 48, the front HRTF filter 50 and the rear HRTF filter 56 of FIGS. 3*a*-3*c* in greater detail. Frequency splitter 46 is implemented as a high pass filter 74 and a summer 76. High pass filter 74 and summer 76 are arranged so that high pass filtered LS channel is combined subtractively with the LS channel signal so that the low frequency surround is output on line 43. The high pass filter 74 is directly coupled to signal line 45, so that the high frequency surround is output on signal line 45. Front/rear scaler is implemented as a summer 78 and a multiplier 80. Multiplier 80 scales the signal by a factor that is related to the relative amplitudes of the signals in the LS channel and the L channel. In the embodiment of FIG. 4, the factor is $$\frac{|\overline{LS}|}{|\overline{LS}|+|\overline{L}|}.$$

Summer 78 and multiplier 80 are arranged so that scaled signal is combined subtractively with the unscaled signal and output on signal line 49 so that the signal on signal line 49 is the input signal scaled by $$\left(1-\frac{|\overline{LS}|}{|\overline{LS}|+|\overline{L}|}\right).$$

Multiplier is directly coupled to signal line 51 so that the signal on the signal line 51 is the input signal scaled by $$\frac{|\overline{LS}|}{|\overline{LS}|+|\overline{L}|}.$$

It can be seen that if $|\overline{LS}|$ approaches zero, the portion of the input signal that is directed to signal line 49 approaches one and the portion of the signal that is directed to signal line 51 approaches zero. Similarly if $|\overline{LS}|$ is much greater that $|\overline{L}|$, the portion of the input signal that is directed to signal line 49 approaches zero and the portion of the input signal that is directed to signal line 51 approaches one. If $|\overline{LS}|$ and $|\overline{L}|$ are approximately equal, then the portion of the input signal that is directed to signal line 49 is approximately equal to the portion of the input signal that is directed to signal line 51. The effect of the front/rear scaler is to orient the apparent source of a sound relative to the listener. If $|\overline{L}|$ is greater that $|\overline{LS}|$, a greater portion of the high frequency surround signal will be directed to the front speaker unit, and the apparent source of the sound is toward the front. If $|\overline{LS}|$ is greater than $|\overline{L}|$, a greater portion of the high frequency surround signal will be directed to the rear speaker unit (or in the absence of a rear speaker unit, be processed so that it will appear to come from the rear) and the apparent source of the sound is toward the rear. If $|\overline{LS}|$ and $|\overline{L}|$ are relatively equal, then an approximately equal portion of the high frequency surround signal will be directed to the front and rear loudspeaker units, and the apparent source of the sound is to the side. The values $|\overline{L}|$ and $|\overline{LS}|$ are made available to multiplier 80 by level detectors 44 of FIGS. 3*a*-3*d*. Scaling factors $$\frac{|\overline{LS}|}{|\overline{LS}|+|\overline{L}|} \text{ and } \left(1-\frac{|\overline{LS}|}{|\overline{LS}|+|\overline{L}|}\right)$$

may be calculated as often as practical. In one implementation, the scaling factors are recalculated at five millisecond intervals.

Front HRTF filter 50 may be implemented as, in order in series, a multiplier 82, a first filter 84 representing the frequency shading effect of the head (hereinafter the head shading filter), a second filter 86 representing the diffraction path delay of the head (hereinafter the head diffraction path delay filter), a third filter 88 representing the diffraction path delay of the pinna (hereinafter the pinna diffraction path delay filter), and a summer 90. Summer 90 sums the output signal from pinna diffraction path delay filter 88 with the output of head diffraction path delay filter 86, the output of head frequency shading filter 84, and the unmultiplied input signal of front HRTF filter 50. Rear HRTF filter 56 may be implemented as, in order in series, multiplier 82, head frequency shading filter 84, pinna diffraction path delay filter 88, head diffraction path delay 86, and a fourth filter 92 representing the frequency shading effect of the rear surface of the pinna (hereinafter the pinna rear frequency shading filter), and a summer 94. Summer 94 sums the output of pinna rear frequency shading filter 92, output of head diffraction path delay filter 86, pinna diffraction path delay filter 88, and the unmultiplied input signal of the rear HRTF filter 56. In one implementation, the signal from head diffraction path delay 86 to summer 94 is scaled by a factor of 0.5 and the signal from pinna rear frequency shading filter 92 to summer 94 is scaled by a factor of two.

Head frequency shading filter 84 is implemented as a first order high pass filter with a single real pole at −2.7 kHz; head diffraction path delay filter 86 is implemented as a fourth order all-pass network with four real poles at −3.27 kHz and four real zeros at 3.27 kHz; pinna diffraction delay filter 88 is implemented as a fourth order all-pass network with four real poles at −7.7 kHz and four real zeros at 7.7 kHz; and pinna rear frequency shading filter 92 is implemented as a first order high pass filter with a single real pole at −7.7 kHz. Multiplier 82 scales the input signal by a factor of $$\frac{Y}{(Y-|\overline{LS}|)+(Y-|\overline{L}|)+Y},$$

where Y is the larger of $|\overline{L}|$ and $|\overline{LS}|$. The values $|\overline{L}|$ and $|\overline{LS}|$ are made available to multiplier 80 by level detectors 44 of FIGS. 3*a*-3*d*. "Pinna" as used herein refers to the auricle portion of the external ear as shown on p. 1367 *Gray's Anatomy,* 38$^{th}$ Edition, Churchill Livingston 1995. "Pinna rear" or "rear surface of the pinna" as used herein, refers to the anterior surface or the external ear, or the external ear as viewed in the direction of the arrow in Appendix 1. The pinna is an acoustic surface for sounds from all directions, while the rear pinna is an acoustic surface only for sounds from directions ranging from the side to the rear.

Filters having characteristics other than those described above (including a filter having a flat frequency response, such as a direct electrical connection) may be used in place of the filter arrangements shown in FIG. 4 and described in the accompanying portion of the disclosure.

Figure 5:
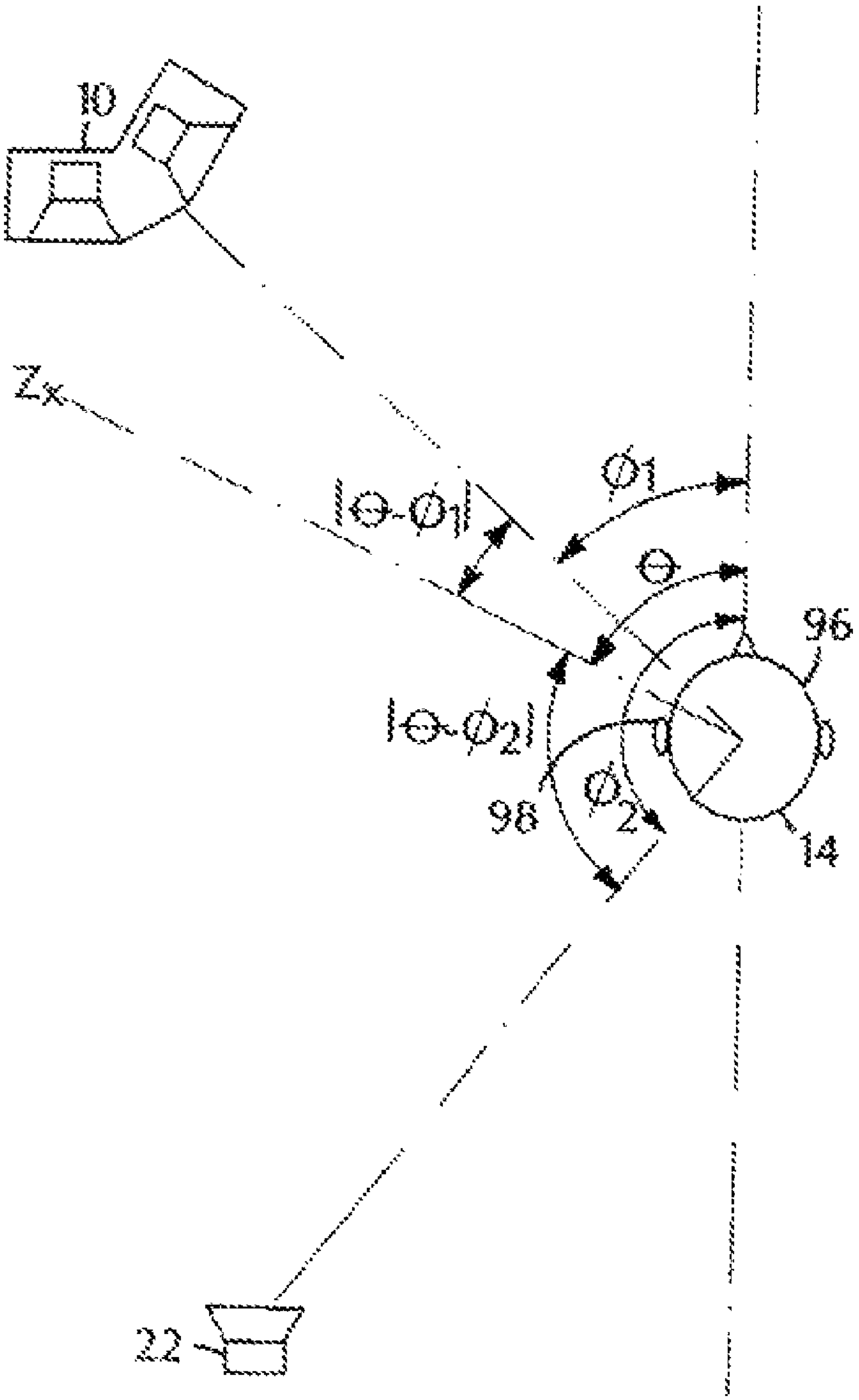
FIG. 5 is a diagrammatic view of a configuration of loudspeakers helpful in explaining aspects of the invention.

FIG. 5 illustrates the purpose of the front speaker placement compensator 60 and the rear speaker placement compensator 66 of FIGS. 3*a*-3*d*. Front speaker placement compensator is implemented as a filter or series of filters that has an effect that is inverse to the front HRTF filter 50 when front HRTF filter 50 acts upon a signal that radiated from a first specific angle. Similarly, the rear speaker placement compensator is implemented as a filter of series of filters that has an effect that is inverse to the rear HRTF filter 56 when rear HRTF filter 56 acts upon a signal that radiated from a second specific angle.

FIG. 5 shows for explanation purposes a sound system according to the configuration of FIG. 3*b*, with desired apparent source of a sound is a point Z, which is oriented at an angle θ relative to a listener 14. All angles in FIG. 5 lie in a horizontal plane which includes the entrances to the ear canals of listener 14. The reference line for the angles is a line passing through the points that are equidistant from the entrances to the ear canals of listener 14. Angles are measured counterclockwise from the front of the listener 14. Placement of the apparent source of the sound at point Z is accomplished in part by the front/rear scaler 48 of FIGS. 3*a*-3*c* and FIG. 4. Front/rear scaler directs more of the high frequency surround signal to the front array 10 than to the rear speaker unit, so that the apparent source of the sound is somewhat forward. Placement of the apparent source of the sound at point Z is further accomplished by the front and rear HRTF filters 50 and 56 (of FIGS. 3*a*-3*d*) respectively. Front and rear HRTF filters 50 and 56 alter the audio signals so that when the signals are transduced to sound waves by front array 10 and limited range acoustical driver 22, the sound waves will have the frequency content and phase relationships as if the sound waves had originated at point Z and had been modified by the head 96 and pinna 98 or listener 14. However, when the sound waves are actually transduced by front array 10 and rear limited range acoustical driver 22, the frequency content and the phase relationships of the sound waves will be modified by the physical head 96 and pinna 98 of listener 14, so that in effect the sound waves that reach the ear canal have the frequency content and phase relationships that have been twice modified by the head and pinna of the listener over angle $\phi_1$. Front speaker placement compensator 60 modifies the audio signal so that when it is transduced by front array 10, the sound waves will not have the change in frequency content and phase relationships attributable to the angle $\phi_1$, leaving in the audio signal the change in frequency and phase relationships attributable to the difference between angle θ and angle $\phi_1$. Then, when the sound waves are transduced by front array 10 and modified by the head and pinna of the listener, the sound waves that reach the ear canal will have the frequency content and phase relationships as a sound from a source at angle θ. Similarly, the rear speaker placement compensator 66 modifies the audio signal so that when it is transduced by rear limited range acoustical driver 22, the sound waves will not have the change in frequency content and phase relationships attributable to the angle $\phi_2$, leaving the change in frequency and phase relationships attributable to the difference between angle θ and angle $\phi_2$. Then, when the sound is transduced by rear limited range acoustical driver 22, the sound waves that reach the ear canal will have the same frequency content and phase relationships as a sound from a source at angle θ. If the speaker configuration is the configuration of FIG. 3*a* the same explanation applies. However the configuration having the limited range rear speaker was chosen to illustrate that the front and rear HRTF filters 50 and 56 and the front and rear speaker placement compensators 60 and 66, all have little effect below frequencies having corresponding wavelengths that approximate the dimensions of the head, for example 2 kHz. In one embodiment, the angles $\phi_1$ and $\phi_2$ are measured and input into audio system so that speaker placement compensators 60 and 66 calculate using the precise angle. One technique for measuring angles $\phi_1$ and $\phi_2$ is to physically measure them. In a second embodiment, speaker placement compensators are set to pre-selected typical values of angles $\phi_1$ and $\phi_2$ (for example 30 degrees and 150 degrees). This second embodiment gives acceptable results, but does not require actual measurement of the speaker placement angles and may require somewhat less complex computing in speaker placement compensators 60 and 66.

Speaker placement compensators 60 and 66 may be implemented as filters having the inverse effect as front and rear HRTF filters, respectively, evaluated for the selected values of angles $\phi_1$ and $\phi_2$, by using values derived from the relationships $$\phi_1 = \arcsin\left[1-\left[\frac{Y-|\overline{LS}|+Y-|\overline{L}|}{Y}\right]\right]$$

and $$\phi_2 = \arcsin\left[1-\left[\frac{Y-|\overline{LS}|+Y-|\overline{L}|}{Y}\right]\right],$$

respectively.

If some filter arrangement other than the filter arrangement of FIG. 4 is used for the front HRTF filter 50 and the rear HRTF filter 56, the front speaker placement compensator 60 and the rear speaker placement compensator 66 may be modified accordingly. If HRTF filters 50 and 56 have a flat frequency response, the front speaker placement compensator 60 and rear speaker placement compensator 66 may be replaced by a filter having a flat frequency response (such as a direct electrical connection).

Figure 6:
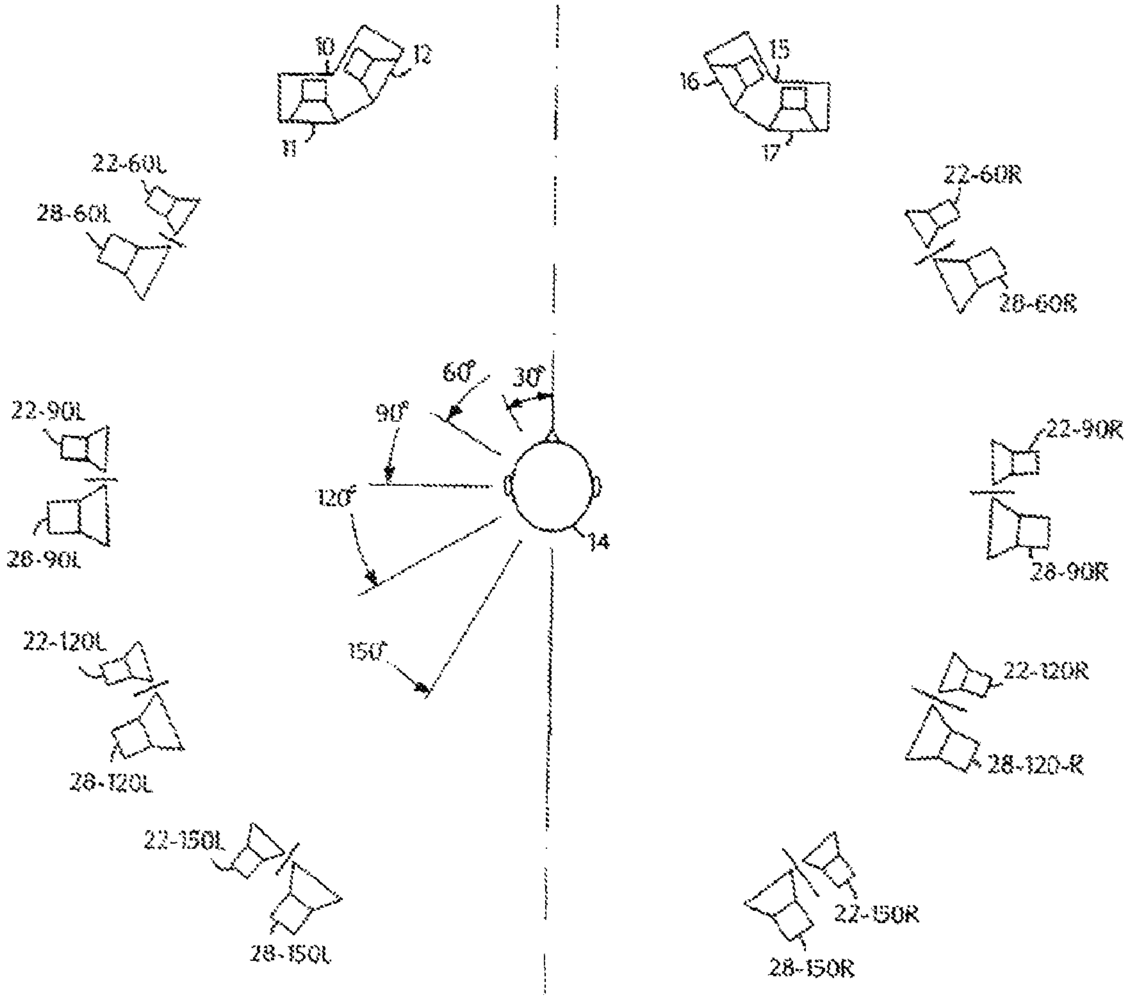
FIG. 6 is a configuration of loudspeaker units for use with another aspect of the invention.

Referring now to FIG. 6, there is shown an example of two more acoustical loudspeaker configurations for illustrating another feature of the invention. In FIG. 6, there is an acoustical driver array 10, similar to the acoustical driver array 10 of FIGS. 1*a*-1*c*, placed at a point displaced by 30 degrees from listener 14. In addition, there are limited range acoustical drivers, similar to the limited range acoustical drivers 22 of FIGS. 1*a*-1*c*, at 60 degrees, 90 degrees, 120 degrees, and 150 degrees OR full range acoustical drivers 28 similar to the full range acoustical drivers 28 of FIGS. 1*a*-1*c*. The limited range acoustical drivers are designated 22-60, 22-90, 22-120, and 22-150, respectively, to indicate the angular position of the limited range acoustical driver. The alternate full range acoustical drivers are designated 28-60, 28-90, 28-120, and 28-150, respectively, to indicate the angular position of the limited range acoustical driver. All angles in FIG. 6 lie in the horizontal plane that includes the entrances to the ear canal of listener 14. The reference line for the angles is a line passing through the points that are equidistant from the entrances to the listener's ear canals. The angles for the acoustical driver units on the left of listener 14 are measured counterclockwise from the reference line in front of the listener. The angles for the acoustical driver units on the right of listener 14 are measured clockwise from the reference line in front of the listener. There may also be other acoustical driver units, such as a center channel acoustical driver unit or a low frequency unit, which are not shown in this view.

Figure 7:
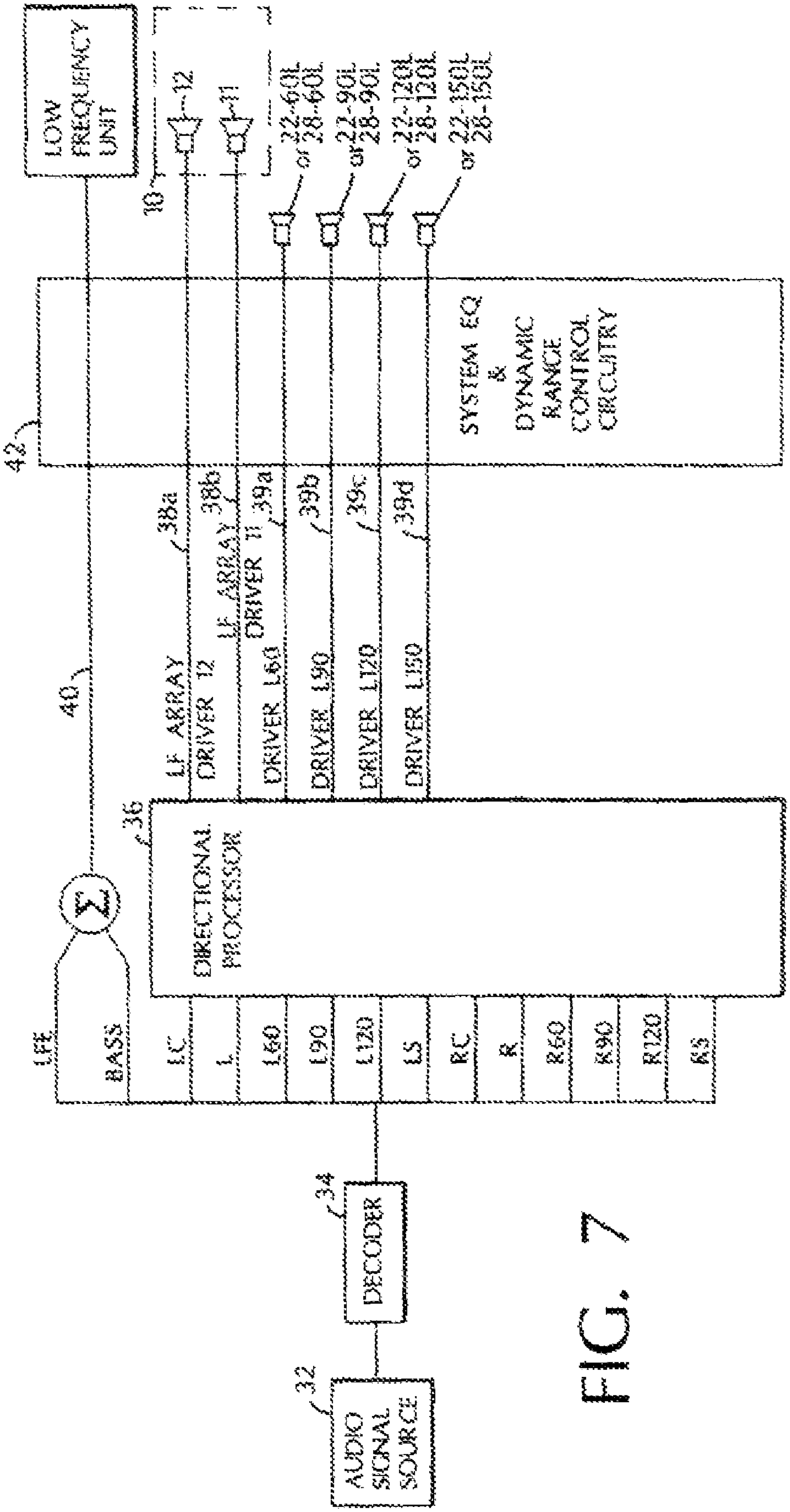
FIG. 7 is a block diagram of an audio signal processing system incorporating another aspect of the invention.

FIG. 7 shows a block diagram of an audio signal processing system for providing audio signals for the loudspeaker units of FIG. 6. An audio signal source 32 is coupled to a decoder 34 which decodes the audio source from the audio signal source into a plurality of channels, in this case a low frequency effects (LFE) channel, and bass channel, and a number of directional channels, including a left (L) channel, a left center (LC) channel, and further including a number of left channels, L60, L90, L120, and LS in which the numerical indicator corresponds to the angular displacement, in degrees, of the channel relative to the listener. There are corresponding right channels, RC, R, R60, R90, R120 and RS. The remainder of the discussion will focus on the left channels, since the right channels can be processed in a similar manner to the left channels. The left channel signals are processed by directional processor 36 to produce output signals for low frequency (LF) array driver 12 on signal line 38*a*, for LF array driver 11 on signal line 38*b*, for driver 22-60L or driver 28-60L on signal line 39*a*, for driver 22-90L or driver 28-90L on signal line 39*b*, for driver 22-120L or 28-120L on signal line 39*c*, and for driver 22-150L or driver 28-150L on signal line 39*d*. As with the embodiment of FIG. 2*a*, the outputs on the signal lines are processed by system EQ and dynamic range controller 42.

In an exemplary embodiment, the directional processor 36 is implemented as digital signal processor (DSPs) executing instructions with digital to analog and analog-to-digital converters as necessary. In other embodiments, the directional processor 36 may be implemented as a combination of DSPs, analog circuit elements, and digital to analog and analog-to-digital converters as necessary.

Figure 8:
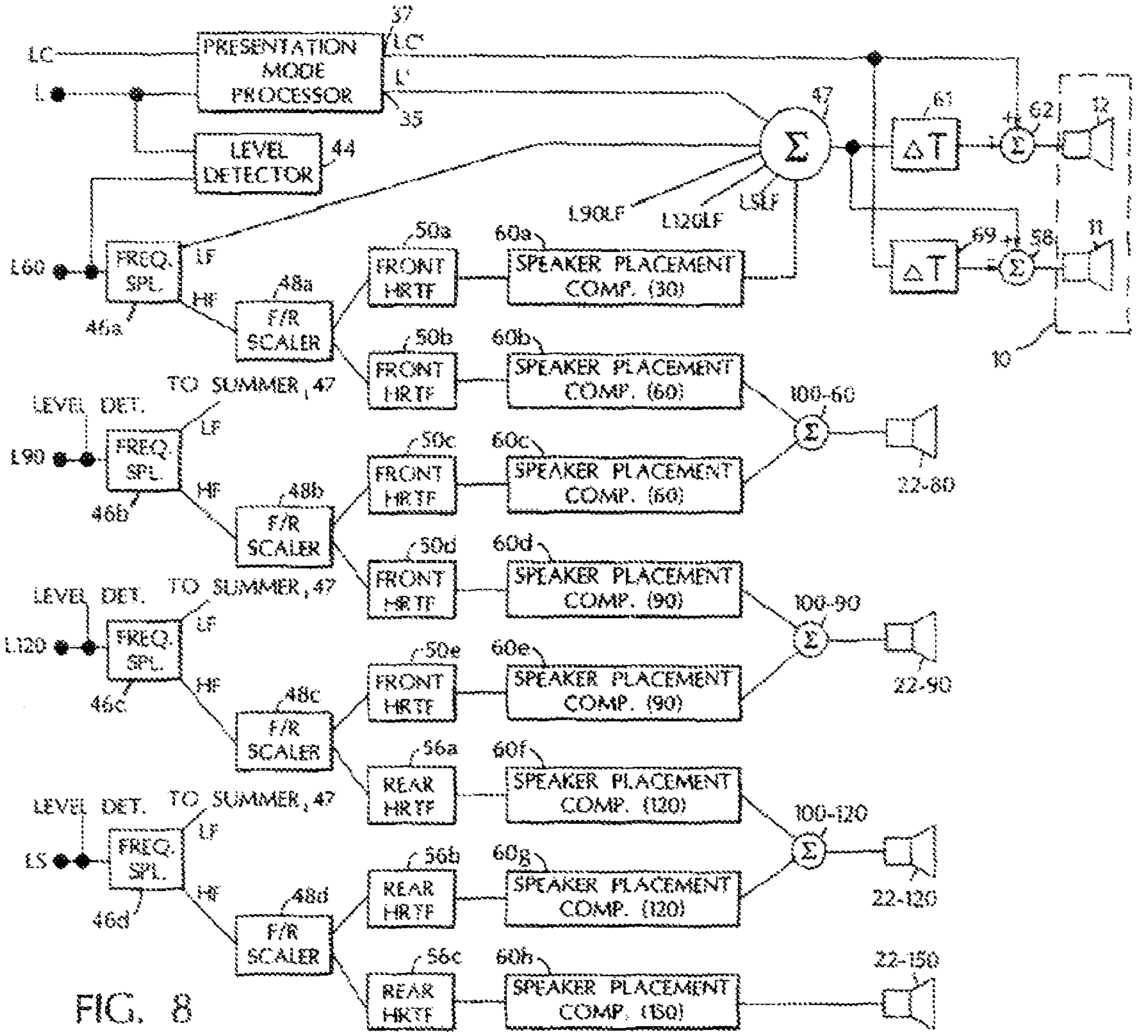
FIG. 8 is a block diagram of a directional processor for use with the audio signal processing system of FIG. 7.

FIG. 8 shows a block diagram of the directional processor 36 of FIG. 7, for an implementation with limited range side and rear acoustical drivers. The directional processor has inputs for five left directional channels. The five directional channels can be created from an audio signal processing system having two channels, a left (L) channel designed, for example, to be radiated at 30 degrees) and a left surround (LS) channel, designed, for example to be radiated at 150 degrees). The L and LS channels can be decoded according the teachings of U.S. patent application Ser. No. 08/796,285, incorporated herein by reference, to produce channel L90 (intended to be radiated at 90 degrees). Channel L and L90 and channels L90 and LS can then be decoded to produce channels L60 and L120, respectively. The invention will work equally well with fewer directional channels or more directional channels. The audio signal processing system of FIG. 7 has several elements that are similar to elements of the system of FIGS. 3*a*-3*d* and perform similar functions to the corresponding elements of FIGS. 3*a*-3*d*. The similar elements use similar reference numbers. Some elements of FIGS. 3*a*-3*d* that are not germane to the invention (such as multiplier 57) are not shown in FIG. 8. A mirror image audio processing system could be created to process right directional channels corresponding to the left directional channels.

Referring now to FIG. 8, the input terminals for channels L60, L90, L120, and LS are coupled to level detector 44 for making measurements for the scalers and HRTF filters. The input terminal for channel L is coupled to presentation mode processor 102. Output terminal 35 designated L' of presentation mode processor 102 is coupled to summer 47. The input terminal for channel LC is coupled to presentation mode processor 102. Output terminal 37 of presentation mode processor 102 designated LC' is coupled subtractively to summer 58 through time delay 58 and additively to summer 62. The audio signal is channel L60 is split by frequency splitter 46*a* into a low frequency (LF) portion and a high frequency (HF) portion. LF portion is input to summer 47. HF portion of the audio signal in channel L60 is input to front/rear scaler 48*a*, (similar to the front/rear scaler 48 of FIGS. 3*a*-3*d* and 4), using the values $|\overline{L}|$ and $|\overline{L60}|$ respectively for the values $|\overline{L}|$ and $|\overline{LS}|$ in the discussion of FIG. 4. Front/rear scaler 48*a* separates the HF portion of the audio signal in channel L60 into a "front" portion and a "rear" portion. Front portion of the HF portion of the audio signal in channel L60 is processed by front HRTF filter 50*a* (similar to the front HRTF filter 50 of FIGS. 3*a*-3*d* and 4), using the values $|\overline{L}|$ and $|\overline{L60}|$ respectively for the values $|\overline{L}|$ and $|\overline{LS}|$ in the discussion of FIG. 4, and speaker placement compensator 60*a*, (similar to the speaker placement compensator 60 of FIGS. 3*a*-3*d* and 4), calculated for 30 degrees, and input to summer 47. Rear portion of the audio signal in channel L60 is processed by front HRTF filter 50*b* (similar to the front HRTF filter 50 of FIGS. 3*a*-3*d* and 4), using the values $|\overline{L}|$ and $|\overline{L60}|$ respectively for the values $|\overline{L}|$ and $|\overline{LS}|$ in the discussion of FIG. 4) and speaker placement compensator 60*a*, similar to the speaker placement compensator 60 of FIGS. 3*a*-3*d* and 4, calculated for 60 degrees, and input to summer 100-60.

The audio signal in channel L90 is split by frequency splitter 46*b* into a low frequency (LF) portion and a high frequency (HF) portion. LF portion is input to summer 47. HF portion of the audio signal in channel L90 is input to front/rear scaler 48*b*, similar to the front/rear scaler 48 of FIGS. 3*a*-3*d* and 4, using the values $|\overline{L60}|$ and $|\overline{L90}|$ respectively for the values $|\overline{L}|$ and $|\overline{LS}|$ in the discussion of FIG. 4. Front/rear scaler 48*b* separates the HF portion of the audio signal in channel L90 into a "front" portion and a "rear" portion. Front portion of the HF portion of the audio signal in channel L90 is processed by front HRTF filter 50*c* (similar to the front HRTF filter of FIGS. 3*a*-3*d* and 4), using the values $|\overline{L90}|$ and $|\overline{L90}|$ respectively for the values $|\overline{L}|$ and $|\overline{LS}|$ in the discussion of FIG. 4), and speaker placement compensator 60*b*, calculated for 60 degrees, and input to summer 100-60. Rear portion of the audio signal in channel L60 is processed by front HRTF filter 50*d* (similar to the front HRTF filter of FIGS.

3*a*-3*d* and 4), using the values |L60| and |L90| respectively for the values |L| and |LS| in the discussion of FIG. 4, and speaker placement compensator 60*d*, (similar to the speaker placement compensator 60 of FIGS. 3*a*-3*d* and 4), calculated for 90 degrees, and input to summer 100-90.

The audio signal in channel L120 is split by frequency splitter 46*c* into a low frequency (LF) portion and a high frequency (HF) portion. LF portion is input to summer 47. HF portion of the audio signal in channel L120 is input to front/rear scaler 48*c*, (similar to the front/rear scaler 48 of FIGS. 3*a*-3*d* and 4), using the values |L90| and |L120| respectively for the values |L| and |LS| in the discussion of FIG. 4. Front/rear scaler 48*c* separates the HF portion of the audio signal in channel L120 into a "front" portion and a "rear" portion. Front portion of the HF portion of the audio signal in channel L120 is processed by front HRTF filter 50*e* (similar to the front HRTF filter 50 of FIGS. 3*a*-3*d* and 4, using the values |L90| and |L120| respectively for the values |L| and |LS| in the discussion of FIG. 4 and speaker placement compensator 60*e* (similar to the speaker placement compensator 60 of FIGS. 3*a*-3*d* and 4), calculated for 90 degrees, and input to summer 100-90. Rear portion of the audio signal in channel L90 is processed by rear HRTF filter 56*a* (similar to the rear HRTF filter 56 of FIGS. 3*a*-3*d* and 4), using the values |L90| and |L120| respectively for the values |L| and |LS|, and speaker placement compensator 60*f* (similar to the speaker placement compensator 60 of FIGS. 3*a*-3*d* and 4), calculated for 120 degrees, and input to summer 100-120.

The audio signal in channel LS is split by frequency splitter 46*d* into a low frequency (LF) portion and a high frequency (HF) portion. LF portion is input to summer 47. HF portion of the audio signal in channel LS is input to front/rear scaler 48*d*, (similar to the front/rear scaler 48 of FIGS. 3*a*-3*d* and 4), using the values |L120| and |LS| respectively for the values |L| and |LS| in the discussion of FIG. 4. Front/rear scaler 48*d* separates the HF portion of the audio signal in channel LS into a "front" portion and a "rear" portion. Front portion of the HF portion of the audio signal in channel LS is processed by rear HRTF filter 56*b* (similar to the rear HRTF filter 56 of FIGS. 3*a*-3*d* and 4), using the values |L120| and |LS| respectively for the values |L| and |LS| in the discussion of FIG. 4, and speaker placement compensator 60*fg* (similar to the speaker placement compensator 60 of FIGS. 3*a*-3*d* and 4), calculated for 120 degrees, and input to summer 100-120. Rear portion of the audio signal in channel LS is processed by rear HRTF filter 56*c* (similar to the rear HRTF filter 56 of FIGS. 3*a*-3*d* and 4), and speaker placement compensator 60*h* (similar to the speaker placement compensator 60 of FIGS. 3*a*-3*d* and 4), calculated for 150 degrees.

The output signal of summer 47 is transmitted additively to summer 58 and subtractively through time delay 61 to summer 62. The output signal of summer 58 is transmitted to full range acoustical driver 11 (of speaker array 10) for transduction to sound waves. The output signal of summer 62 is transmitted to full range acoustical driver 12 for transduction to sound waves. Time delay 61 facilitates the directional radiation of the signals combined at summer 47. Output signals of summers 100-60, 100-90, 100-120, and of speaker placement compensator 60*h* are transmitted to limited range acoustical drivers 22-60, 22-90, 22-120, and 22-150, respectively, for transduction to sound waves.

Figure 9:
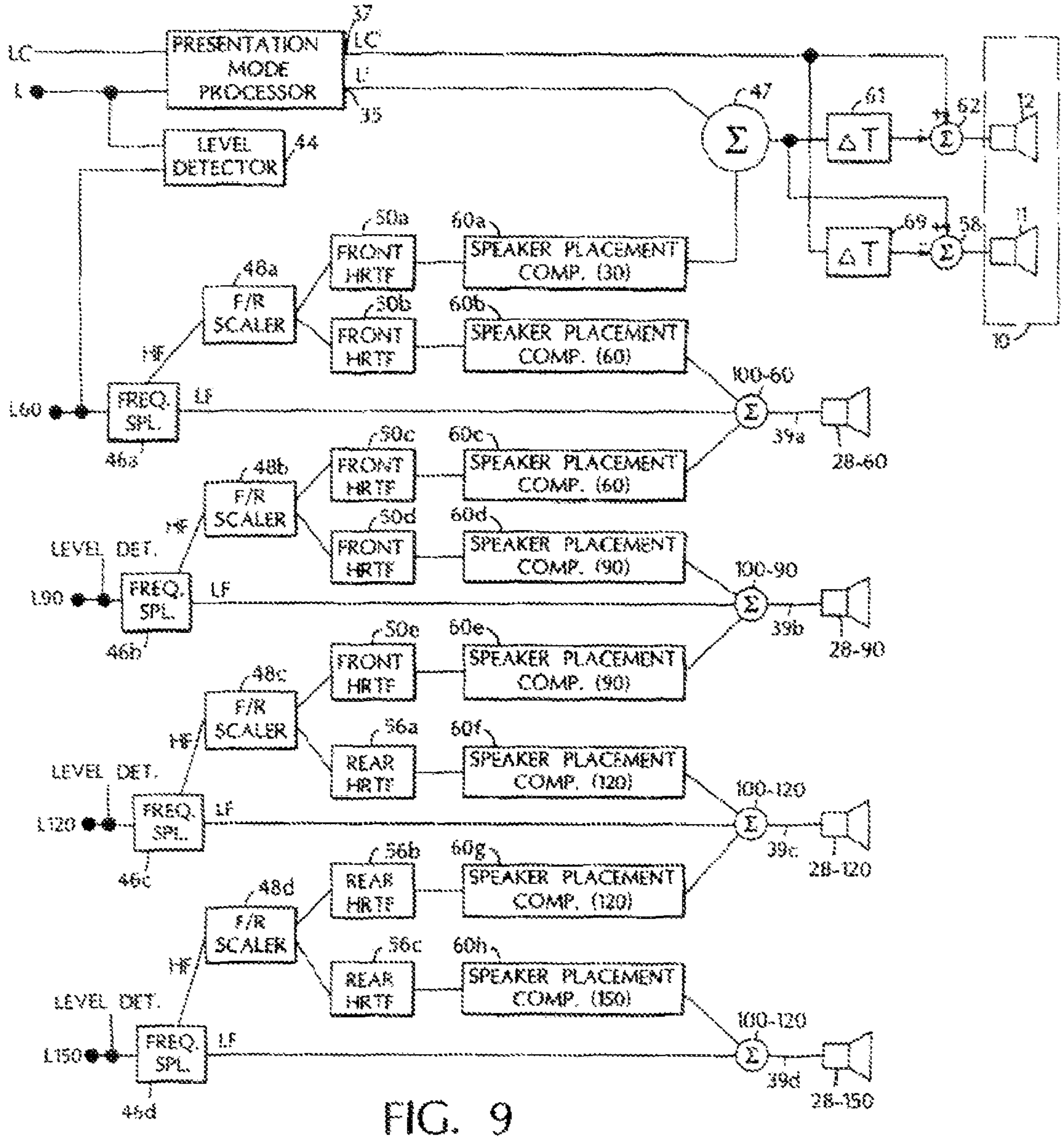
FIG. 9 is a block diagram of an alternate directional processor for use with the audio signal processing system of FIG. 7.

FIG. 9 shows the directional processor of FIG. 7 for an implementation having full range side and rear acoustical drivers. The implementation of FIG. 9 has the same input channels as the implementation of FIG. 7. The invention will work with fewer directional channels or more directional channels. The audio signal processing system of FIG. 7 has several elements that are similar to elements of the system of FIGS. 3*a*-3*d* and perform similar functions to the corresponding elements of FIGS. 3*a*-3*d*. The similar elements use similar reference numerals. A mirror image audio processing system could be created to process right directional channels corresponding to the left directional channels.

FIG. 9 is similar to FIG. 8, except for the following. The low frequency (LF) signal line from frequency splitter 46*a* is coupled to summer 100-60 instead of summer 47; the LF signal line from frequency splitter 46*b* is coupled to summer 100-90 instead of summer 47; the LF signal line from frequency splitter 46*c* is coupled to summer 100-120 instead of summer 47; the LF signal line from frequency splitter 46*d* is coupled to summer 100-150 instead of summer 47; and the output of speaker placement compensator 60*h* is coupled to a summer 100-150. Output signals of summers 100-60, 100-90, 100-120, and 100-150 are transmitted to full range acoustical drivers 28-60, 28-90, 28-120, and 28-150, respectively, for transduction to sound waves.

Figure 10A:
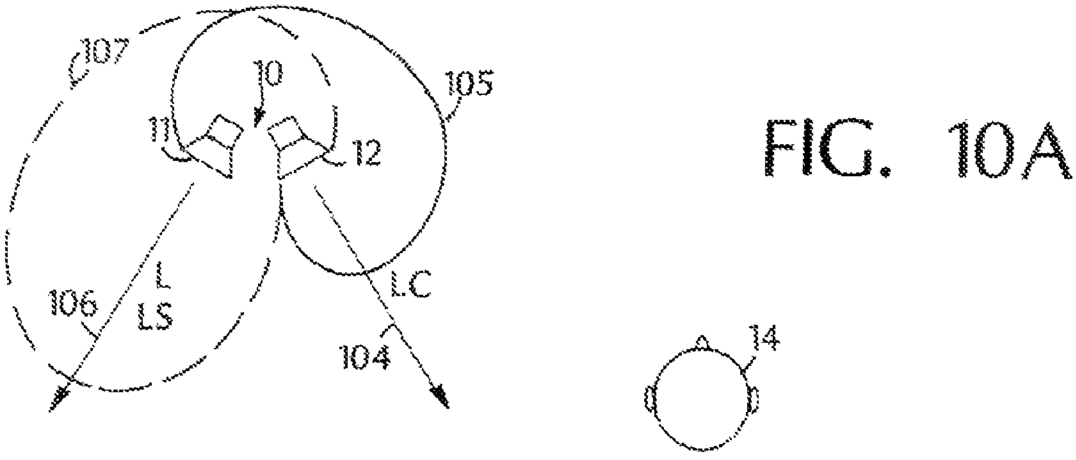
FIGS. 10*a*-10*c* are top diagrammatic views of some of the components of an audio system for describing another feature of the invention.
Figure 10B:
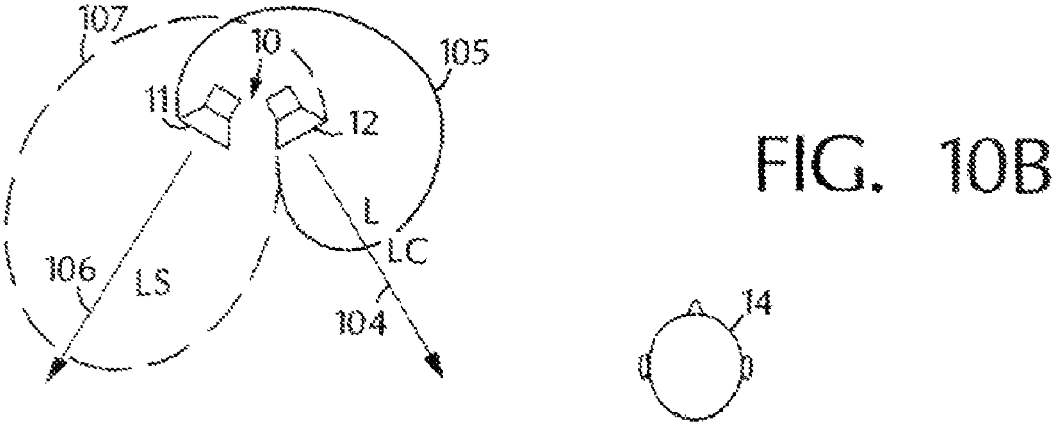
Figure 10C:
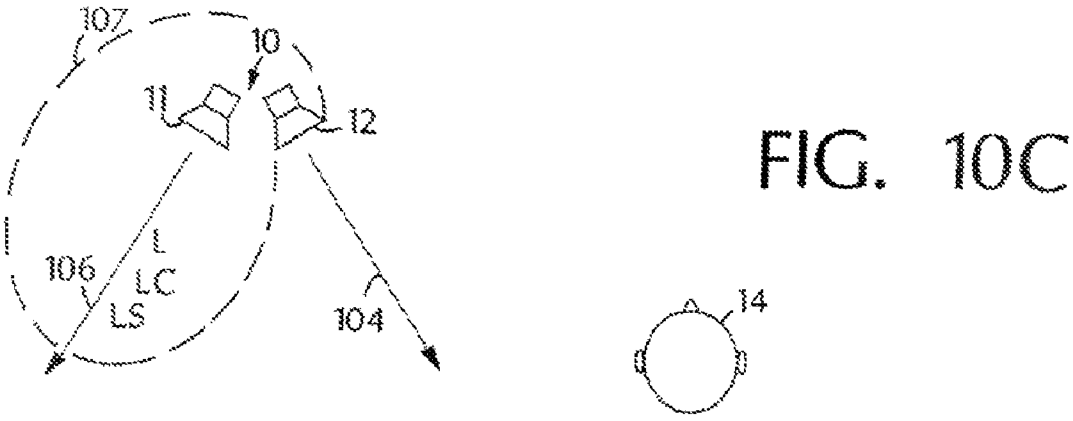

Referring now to FIGS. 10*a*-10*c*, there are shown three top diagrammatic views of some of the components of an audio system for describing another feature of the invention. As described in patents such as U.S. Pat. Nos. 5,809,153 and 5,870,484, arrays of acoustical drivers and signal processing techniques can be designed to radiate sound waves directionally. By radiating the same sound wave from two acoustical drivers subtractively (functionally equivalent to out of phase) and time-delayed, a radiation pattern can be created in which the acoustic output is greatest along one axis (hereinafter the primary axis) and in which the acoustic output is minimized in another direction (hereinafter the null axis). In FIGS. 10*a*-10*c*, an array 10, including acoustical drivers 11 and 12 is arranged as in an audio system shown in FIGS. 1*a*-1*c*, 2*a*, and FIGS. 3*a*-3*d*. The parameters of time delay 64 of FIGS. 3*a*-3 *d* are set such that a signal that is transmitted undelayed to acoustical driver 12 and delayed to acoustical driver 11 and transduced results in a radiation pattern that has a primary axis in a direction 104 generally toward a listener 14 in a typical listening position, a null axis in a direction 106 generally away from listener 14 in a typical listening position, and a radiation pattern 105 as indicated in solid line. The parameters of time delay 61 of FIGS. 3*a*-3*d* are set such that a signal that is transmitted undelayed to acoustical driver 11 and delayed to acoustical driver 12 and transduced results in a radiation pattern that has a primary axis in direction 106 generally away from a listener 14 in a typical listening position, a null axis in direction 104 generally toward listener 14 in a typical listening position, and a radiation pattern 107 as indicated in dashed line. In FIG. 10*a*, the audio signal in channel LC is processed and radiated such that the radiation pattern has a primary axis in direction 104 and a null axis in direction 106 and the audio signal in channels L and LS are processed and radiated such that they have a primary axis in direction 106. In FIG. 10*b*, the audio signal in channels L and LC are processed and radiated such that the radiation patterns have a primary axis in direction 104 and a null axis in direction 106, and the audio signal in channel LS in processed and radiated such that it has a primary axis in direction 106 and a null axis in direction 104. In FIG. 10*c*, the audio signals in channels L, LC, and LS are processed and radiated such that they all have primary axes in direction 106 and null axes in direction 104. Hereinafter, the combination of radiation patterns, primary axes, and null axes will referred to as "presentation modes." Generally, the presentation mode of FIG. 10*a* is preferable when the audio system is used as a part of a home theater system, in which is desirable to have a strong center acoustic image and a "spacious" feel to the directional channels. The presentation mode of FIG. 10*b* may be preferable when the audio system is used to play music, when center image is not so important. The presentation mode of FIG. 10*c* may be preferable if the audio system is placed in a situation in which the array 10 must be placed very close to a center line (that is when the angle $\phi_1$ of FIG. 5 is small). As with several of the previous figures, there may be mirror image audio system for processing the right side directional channels.

Figure 11:
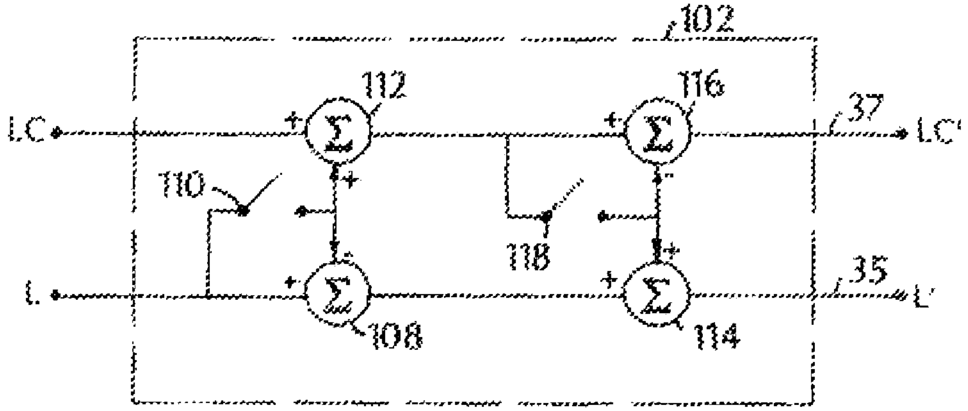
FIG. 11 is a block diagram of a component of FIGS. 3*a*-3*d*. for creating directional channels in accordance with the invention.

Referring now to FIG. 11, there is shown presentation mode processor 102 (of FIGS. 3*a*-3*c*, 8, and 9) in more detail. Channel L input is connected additively to summer 108 and to the one side of switch 110. Other side of switch 110 is connected additively to summer 112 and subtractively to summer 108. Channel LC is connected additively to summer 112 which is connected additively to summer 116 and to one side of switch 118. Other side of switch 118 is connected additively to summer 114 and subtractively to summer 116. Summer 114 is connected to terminal 35, designated L'. Summer 116 is connected to terminal 37, designated LC'. Depending on whether switches 110 and 118 are in the open or closed position, the signal at output terminal 35 (designated L') may be the signal that was input from channel L, the combined input signals from channels L and LC, or no signal. Depending on whether switches 110 and 118 are in the open or closed position, the signal at output terminal 37 (designated LC') may be the signal that was input from channel LC, the combined input signals from channels L and LC, or no signal.

Referring now to any of FIGS. 3*a*-3*c*, the output signal of terminal 35 is summed with the low frequency portion of the surround channel at summer 47, and is transmitted to summer 58, which is coupled to acoustical driver 11, and through time delay 61 to summer 62, which is coupled to acoustical driver 12. The output signal of terminal 37 is coupled to summer 62 and through time delay 64 to summer 58. Thus the output of terminal 35 is summed with the low frequency (LF) portion of the left surround (LS) signal and transmitted undelayed to acoustical driver 11 and delayed to acoustical driver 12. The output of terminal 37 is transmitted undelayed to acoustical driver 12 and delayed to acoustical driver 11. As taught above in the discussion of FIGS. 10*a*-10*c*, the parameters of time delay 64 may be set so that an audio signal that is transmitted undelayed to acoustical driver 12 and delayed to acoustical driver 11 and transduced results in an radiation pattern that has a primary axis in direction 104 of FIGS. 10*a*-10*b*. Similarly, the discussion of FIGS. 10*a*-10*c* teaches that the parameters of time delay 61 may be set so that an audio signal that is transmitted undelayed to acoustical driver 11 and delayed to acoustical driver 12 and transduced results in radiation pattern that has a primary axis in direction 106 of FIGS. 10*a*-10*b*. Therefore, by setting the switches 110 and 118 of presentation mode processor 102 to the "closed" or "open" position, it is possible for a user to achieve the presentation modes of FIGS. 10*a*-10*c*. The table below the circuit of FIG. 11 shows the effect of the various combinations of "open" and "closed" positions of switches 110 and 118. For each of the four combinations, the table shows which of channels L and LC are output on the output terminals designated L' and LC' (terminals 35 and 37, respectively), which channels when radiated have a radiation pattern that has a primary axis in direction 104 and a null axis in direction 106 and which have a primary axis in direction 106 and a null axis in direction 104, and which of FIGS. 10*a*-10*c* are achieved by the combination of switch settings. In the implementation of FIGS. 3*a*-3*c*, 10, and 11, the low frequency portion of surround channel LS is always radiated with the primary axis in direction 106. Also, if switch 118 is in the closed position, the radiation pattern of FIG. 10*c* results, regardless of the position of switch 110.

In the implementations of FIGS. 8 and 9, the presentation mode processor 102 has the same effect on input channels L and LC and the signals on the output terminals 35 and 37 (designated L' and LC', respectively).

It is evident that those skilled in the art may now make numerous modifications of and departures from the specific apparatus and techniques herein disclosed without departing from the inventive concepts. Consequently, the invention is to be construed as embracing each and every novel feature and novel combination of features herein disclosed and limited only by the spirit and scope of the appended claims.

What is claimed is:

1. A method for processing audio signals, comprising:

electroacoustically directionally transducing by a first directional loudspeaker unit positioned in front of a listening position a first audio signal which is a first surround channel to produce a first radiation pattern with a first primary axis along which the acoustic output is greatest and a first null axis along which the acoustic output is the least;

electroacoustically directionally transducing by the directional loudspeaker unit a second audio signal which is a first non-surround channel to produce a second radiation pattern with a second primary axis along which the acoustic output is greatest and a second null axis along which the acoustic output is the least;

providing a user with a capability of alternatively selecting a first combined radiation pattern in which the first primary axis and the second primary axis are in substantially the same direction or a second combined radiation pattern in which the first primary axis and the second primary axis are in different directions.

2. A method for processing audio signals in accordance with claim 1, further comprising electroacoustically transducing a third audio signal which is a second non-surround channel by said directional loudspeaker unit in a third radiation pattern with a third primary axis along which the acoustic output is greatest and a third null axis along which the acoustic output is the least.

3. A method for processing audio signals in accordance with claim 2, wherein said third audio signal is limited to a frequency range having a lower limit at a frequency that has a corresponding wavelength that approximates the dimensions of a human head and wherein said speaker unit is designed and constructed to electroacoustically transduce audio signals having frequencies in said frequency range.

4. A method for processing audio signals in accordance with claim 3, wherein said third audio signal comprises a first spectral band of a scaled, filtered audio signal representing the second non-surround channel.

5. A method for processing audio signals in accordance with claim 2, wherein said third audio signal comprises a filtered scaled first spectral band of an input audio signal representing the second non-surround channel and a second spectral band of said input audio signal.

6. The method of claim 1, further comprising providing the user with a capability to cause the first null axis and the second null axis to be in substantially the same direction.

7. The method of claim 6, wherein the first primary axis and the second primary axis are toward the user.

8. The method of claim 2, further comprising providing the user with a capability of alternatively selecting (a) a first combined radiation pattern in which the first primary axis, the second primary axis, and the third primary axis are in substantially the same direction;

(b) a second combined radiation pattern in which the first primary axis and the second primary axis are in substantially the same direction, and the third primary axis is in a different direction; or (c) a third combined radiation pattern in which the first primary axis and the third primary axis are in substantially the same direction and the second primary axis in the a different direction.

9. An audio system, comprising:

a directional loudspeaker unit positioned in front of a listening position to radiate a first surround channel in a first radiation pattern with a first primary axis along which the acoustic output is greatest and a first null axis along which the acoustic output is the least and to radiate a first non-surround channel in a second radiation pattern with a first primary axis along which the acoustic output is greatest and a first null axis along which the acoustic output is the least; and circuitry providing a user with a capability of alternatively selecting a first combined radiation pattern in which the first primary axis and the second primary axis are in substantially the same direction or a second combined radiation pattern in which the first primary axis and the second primary axis are in different directions.

10. The audio system of claim 9, wherein the directional loudspeaker unit is further to radiate a second non-surround channel in a third radiation pattern with a third primary axis along which the acoustic output is greatest and a third null axis along which the acoustic output is the least.

11. The audio system of claim 9, further comprising circuitry providing the user with a capability to cause the first null axis and the second primary axis to be in substantially the same direction causing, and the first primary axis and the second primary axis to be in substantially the same direction.

12. The audio system of claim 10, wherein an audio signal in the second non-surround channel is limited to a frequency range having a lower limit at a frequency that has a corresponding wavelength that approximates the dimensions of a human head.

13. The audio system of claim 12, wherein the audio signal in the second non-surround channel comprises a first spectral band of a scaled, filtered audio signal.

14. The method of claim 11, wherein the first primary axis and the second primary axis are toward the user.

* * * * *